(12) United States Patent
Shin et al.

(10) Patent No.: US 10,510,900 B2
(45) Date of Patent: Dec. 17, 2019

(54) DISPLAY DEVICE

(71) Applicant: SAMSUNG DISPLAY CO., LTD., Yongin-si, Gyeonggi-Do (KR)

(72) Inventors: Hyun Eok Shin, Gwacheon-si (KR); Sang Won Shin, Yongin-si (KR); Dong Min Lee, Anyang-si (KR); Ju Hyun Lee, Seongnam-si (KR); Shin Il Choi, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/686,415

(22) Filed: Aug. 25, 2017

(65) Prior Publication Data
US 2018/0069128 A1 Mar. 8, 2018

(30) Foreign Application Priority Data

Sep. 7, 2016 (KR) .......................... 10-2016-0115025

(51) Int. Cl.
*H01L 29/786* (2006.01)
*G02F 1/1362* (2006.01)
(Continued)

(52) U.S. Cl.
CPC .. *H01L 29/78633* (2013.01); *G02F 1/136209* (2013.01); *G02F 1/136286* (2013.01); *H01L 27/124* (2013.01); *H01L 27/1262* (2013.01); *G02F 1/1368* (2013.01); *G02F 2001/13629* (2013.01); *G02F 2001/136295* (2013.01); *H01L 27/3262* (2013.01); *H01L 27/3272* (2013.01); *H01L 27/3276* (2013.01);
(Continued)

(58) Field of Classification Search
CPC ......... H01L 27/124; H01L 2224/73204; H01L 27/3276; H01L 2224/16225; H01L 2224/32225; H01L 29/7869; H01L 27/1225; H01L 2924/00; H01L 2224/48091
See application file for complete search history.

(56) References Cited

U.S. PATENT DOCUMENTS

2006/0042728 A1 3/2006 Lemon et al.
2014/0048783 A1* 2/2014 Han .................... C23C 14/3414
257/40

FOREIGN PATENT DOCUMENTS

EP 0716334 * 12/1996
KR 10-1999-0024917 4/1999
(Continued)

*Primary Examiner* — Tony Tran
(74) *Attorney, Agent, or Firm* — F. Chau & Associates, LLC

(57) ABSTRACT

A display device according to an exemplary embodiment of the present invention includes: a substrate; a gate line and a data line that are provided on the substrate and are insulated from each other; a thin film transistor that is connected with the gate line and the data line; and a pixel electrode that is connected with the thin film transistor, in which at least one of the gate line and the data line includes a metal layer and a blocking layer that contacts the metal layer, and the blocking layer includes a first metal from a first group including molybdenum (Mo) and tungsten (W), a second metal from a second group including vanadium (V), niobium (Nb), zirconium (Zr), and tantalum (Ta), and oxygen (O).

9 Claims, 21 Drawing Sheets

(51) Int. Cl.
*H01L 27/12* (2006.01)
*G02F 1/1368* (2006.01)
*H01L 27/32* (2006.01)

(52) U.S. Cl.
CPC .. *H01L 2227/323* (2013.01); *H01L 2251/533* (2013.01); *H01L 2251/5315* (2013.01)

(56) References Cited

FOREIGN PATENT DOCUMENTS

| KR | 10-0686333 | | 2/2007 |
|---|---|---|---|
| KR | 1020050003924 | * | 2/2007 |
| KR | 10-0702284 | | 3/2007 |
| KR | 10-1602486 | | 3/2016 |

* cited by examiner

DISPLAY DEVICE

CROSS-REFERENCE TO RELATED APPLICATION

This application claims priority under 35 U.S.C. § 119 to Korean Patent Application No. 10-2016-0115025 filed in the Korean Intellectual Property Office on Sep. 7, 2016, the entire contents of which are incorporated by reference herein.

TECHNICAL FIELD

The present invention relates to a display device and a method for manufacturing the same.

DISCUSSION OF RELATED ART

In a display device, each pixel electrode receives a different voltage such that an image is displayed. In this case, a thin film transistor, which is a three-terminal switching element that switches voltages applied to the pixel electrodes, is connected to each pixel electrode, a gate line that transmits a signal for controlling the thin film transistor, and a data line that transmits a voltage to be applied to each pixel electrode.

The thin film transistor may individually control each emission element not only in a liquid crystal display (LCD), but also in an active organic light emitting diode (OLED), which is a self-emissive element.

In such a display device, the gate line and/or the data line may be made of a metal having excellent electrical conductivity. However, wires that include the metal used in the gate line and/or the data line may reflect external light, thereby causing deterioration of display quality.

SUMMARY

The present invention provides a display device that may reduce reflection of external light by metal wires, and a method for manufacturing the same.

A display device according to an exemplary embodiment of the present invention includes: a substrate; a gate line and a data line that are provided on the substrate and are insulated from each other; a thin film transistor that is connected with the gate line and the data line; and a pixel electrode that is connected with the thin film transistor, in which at least one of the gate line and the data line includes a metal layer and a blocking layer that contacts the metal layer, and the blocking layer includes a first metal from a first group including molybdenum (Mo) and tungsten (W), a second metal from a second group including vanadium (V), niobium (Nb), zirconium (Zr), and tantalum (Ta), and oxygen (O).

A content of the second metal may be about 3 to 10 wt % with respect to the entire content of the blocking layer.

The metal layer may include a first layer that includes at least one of aluminum (Al) and copper (Cu).

The metal layer may further include a second layer that is provided between the substrate and the first layer, and the second layer, the first layer, and the blocking layer may be sequentially stacked on the substrate.

The display device may emit light in a direction toward the thin film transistor from the substrate.

The second layer may include titanium (Ti).

The display device may further include an insulation layer that is provided between the substrate and the blocking layer.

The display device may emit light in a direction toward the substrate from the thin film transistor.

The insulation layer may include one of silicon oxide (SiOx), silicon nitride (SiNy), silicon oxynitride (SiOxNy), titanium oxide (TiO$_2$), and aluminum oxide (Al$_2$O$_3$), where x and y are non-zero positive real numbers.

The blocking layer may be provided between the substrate and the metal layer.

The metal layer may be provided on the blocking layer, and may include a first layer that includes at least one of aluminum (Al) and copper (Cu) and a second layer that is provided on the first layer.

The second layer may include titanium (Ti).

According to an exemplary embodiment of the present invention, a method for manufacturing a display device is provided. The method includes: forming a gate line and a data line, that are insulated from each other, on a substrate; forming a thin film transistor that is connected with the gate line and the data line; and forming a pixel electrode that is connected with the thin film transistor, in which at least one of the gate line and the data line includes a metal layer and a blocking layer that contacts the metal layer, the blocking layer includes a first metal from a first group including molybdenum (Mo) and tungsten (W), a second metal from a second group including vanadium (V), niobium (Nb), zirconium (Zr), and tantalum (Ta), and oxygen (O), and the gate line and the data line are manufactured through a dry-etching process.

The dry-etching process may be performed once.

A cleaning process may be performed after the dry-etching process is performed.

The blocking layer may be manufactured through a deposition process that uses a single target.

The deposition process may not use oxygen (O$_2$) gas.

The deposition process may use non-reactive sputtering.

According to an exemplary embodiment of the present invention, a display device includes: a substrate; a gate line and a data line that are provided on and above the substrate and at least one of them comprises a metal layer and a blocking layer; a thin film transistor that is connected with the gate line and the data line; and a pixel electrode that is connected with the thin film transistor, in which when the display device is a top emission type display device, the blocking layer is on top of the metal layer that is above the substrate, when the display device is a bottom emission type display device, the metal layer is on top of the blocking layer that is above the substrate, and the blocking layer includes a metal oxide including about 3 to 10 wt % of a metal from one of vanadium (V), niobium (Nb), zirconium (Zr), and tantalum (Ta).

The metal oxide of the blocking layer may further include a metal from one of molybdenum (Mo) and tungsten (W).

According to one or more exemplary embodiments of the present invention, deterioration of display quality of the display device, caused by reflection of external light in the metal wires, may be prevented. Further, a process for manufacturing a metal wire that can realize low reflection may be provided.

BRIEF DESCRIPTION OF THE DRAWINGS

These and other features of the present invention will become more apparent by describing in detail exemplary embodiments thereof with reference to the accompanying drawings in which.

Figure 1:
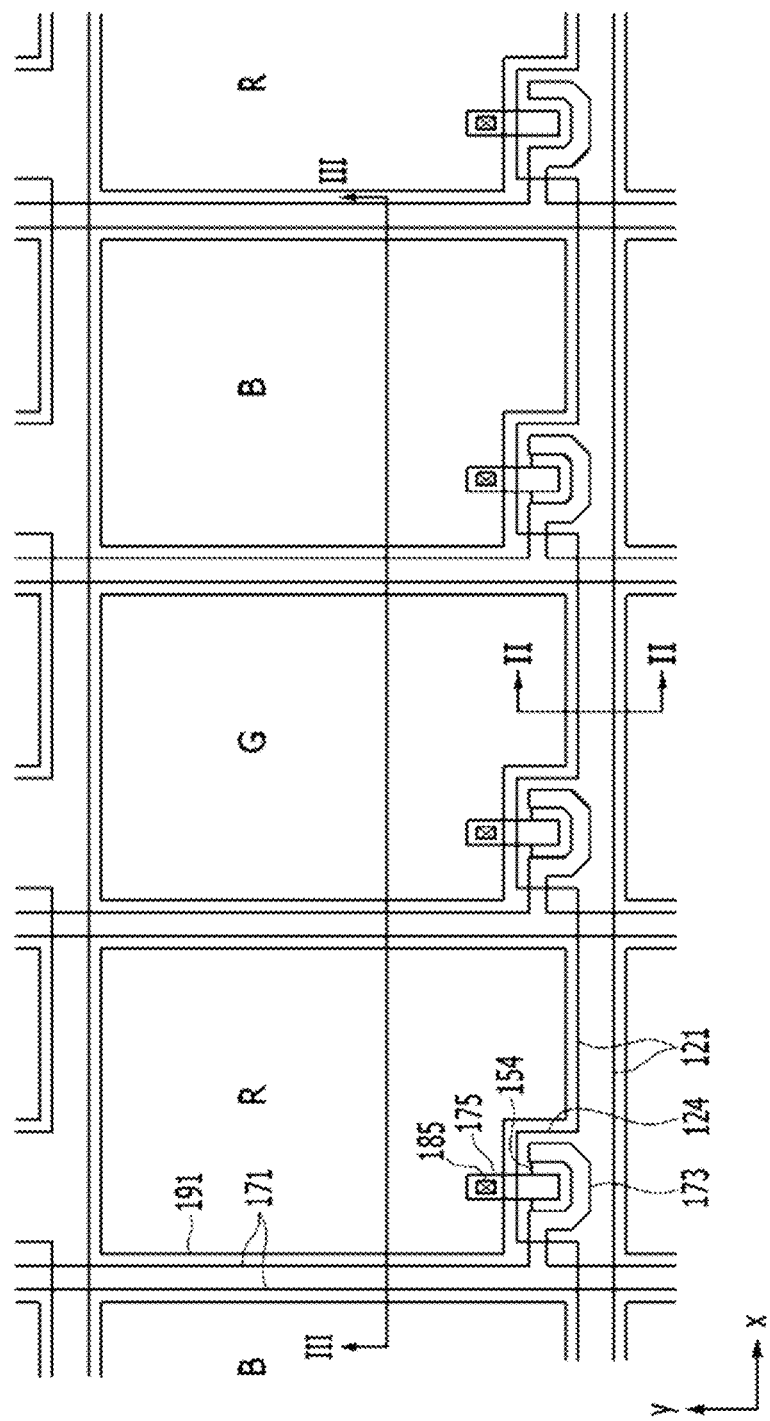
FIG. 1 is a top plan view of a pixel area of a display device according to an exemplary embodiment of the present invention.

Since the drawings in FIGS. 1-21 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present invention will be described more fully hereinafter with reference to the accompanying drawings, in which exemplary embodiments of the present invention are shown. As those skilled in the art would realize, the described exemplary embodiments herein may be modified in various different ways, all without departing from the spirit or scope of the present invention.

The drawings and description are to be regarded as illustrative in nature and not restrictive. Like reference numerals designate like elements throughout the specification.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Further, throughout the specification, the word "on" may mean positioned on or below the object portion, but does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In this specification, the phrase "a plan view" means a target portion viewed from the top, and the phrase "a cross-section" means a cross-section formed by vertically cutting a target portion and viewed from the side.

Figure 2:
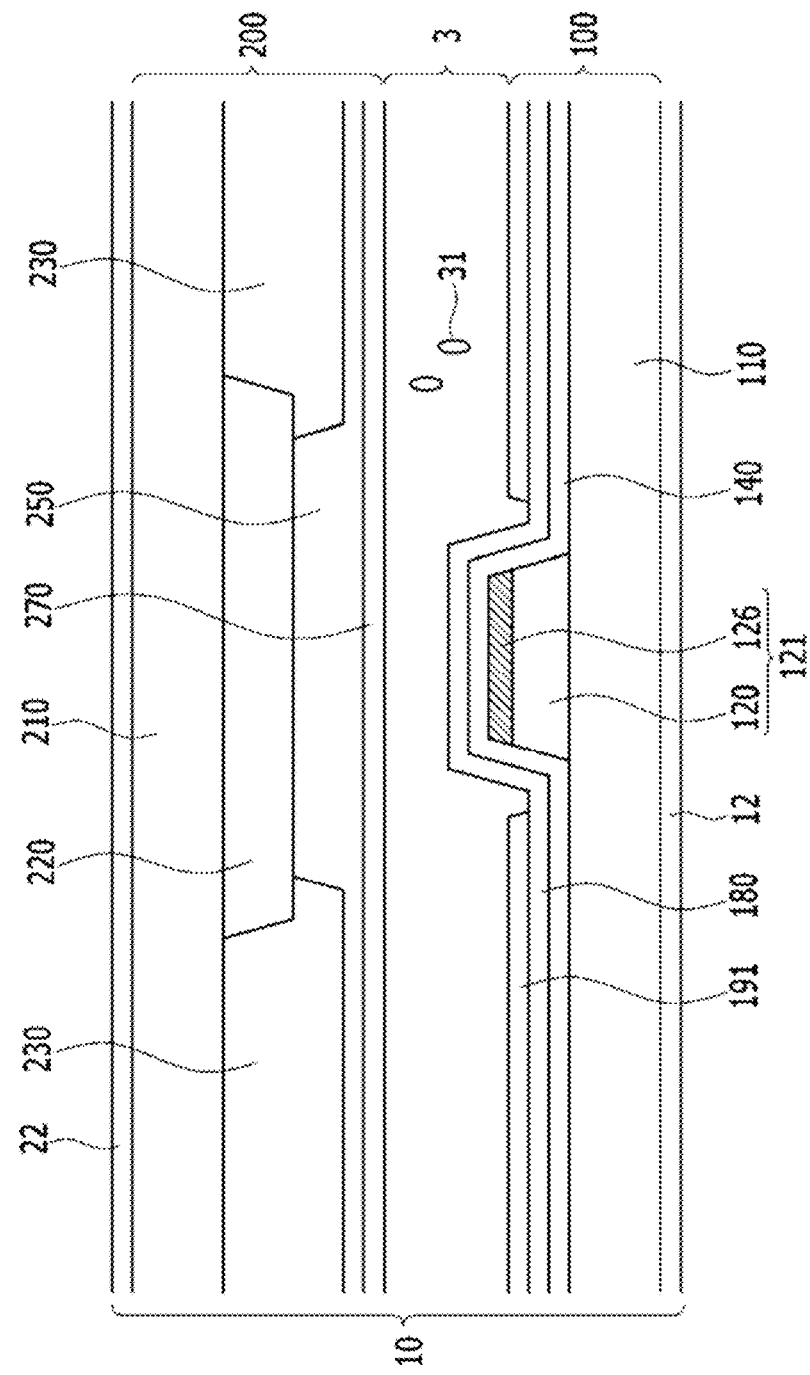
FIG. 2 is a cross-sectional view of FIG. 1, taken along line II-II.
Figure 3:
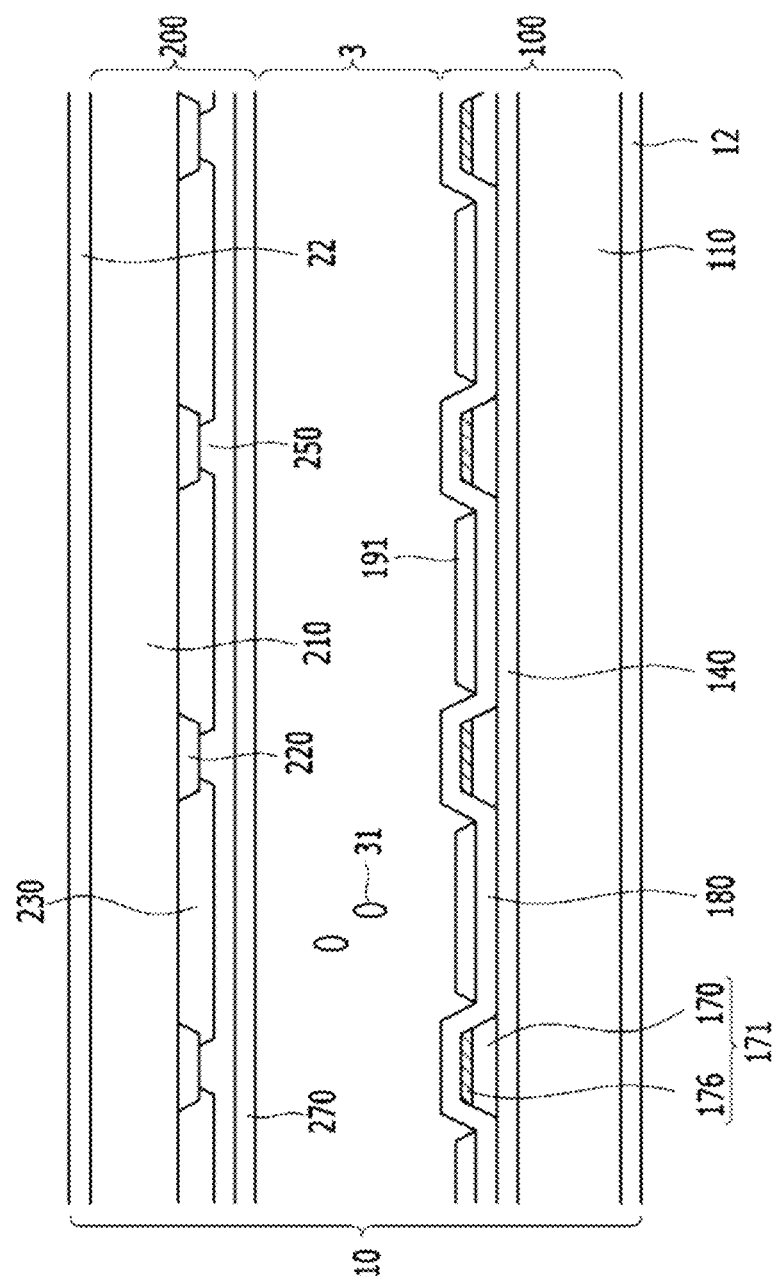
FIG. 3 is a cross-sectional view of FIG. 1, taken along line III-III.

FIG. 1 is a top plan view of a pixel area of a display device according to an exemplary embodiment of the present invention, FIG. 2 is a cross-sectional view of FIG. 1, taken along line II-II, and FIG. 3 is a cross-sectional view of FIG. 1, taken along line According to an exemplary embodiment of the present invention, light of a display device 10 is emitted in a direction from a first substrate 110 toward a thin film transistor.

The display device 10 includes a lower panel 100, an upper panel 200 that overlaps the lower panel 100, and a liquid crystal layer 3 that is provided between the lower panel 100 and the upper panel 200 and includes a plurality of liquid crystal molecules 31. The display device 10 according to an exemplary embodiment of the present invention may be a top emission type display device that emits light in a direction toward the upper panel 200 from the lower panel 100.

The lower panel 100 includes the first substrate 110, and a plurality of pixels are arranged in a matrix format on the first substrate 110. Gate lines 121, that extend in the x-axis direction and include a gate electrode 124, are provided on the first substrate 110.

The gate lines 121 according to the present exemplary embodiment may include a metal layer 120 and a blocking layer 126.

The metal layer 120 is provided between the first substrate 110 and a gate insulating layer 140.

The metal layer 120 includes a material that has excellent electrical conductivity, and may include, for example, at least one of aluminum (Al) and copper (Cu).

The blocking layer 126 is disposed to be in contact with the metal layer 120, and is disposed between the first substrate 110 and the gate insulating layer 140, specifically, between the metal layer 120 and the gate insulating layer 140. That is, the blocking layer 126 is on top of the metal layer 120 which is above the substrate 110, for the top emission type display device.

The blocking layer 126 includes a metal having a high absorption coefficient, such that the blocking layer 126 may absorb external light and/or may destructively interfere with the external light. The blocking layer 126 may include a metal oxide.

The blocking layer 126 may include a first metal from one of a first group including molybdenum (Mo) and tungsten (W), a second metal from one of a second group including vanadium (V), niobium (Nb), zirconium (Zr), and tantalum (Ta), and oxygen (O). As an example, the blocking layer 126 may include one of Mo—V—Ox, Mo—Nb—Ox, Mo—Zr—Ox, Mo—Ta—Ox, W—V—Ox, W—Nb—Ox, W—Zr—Ox, and W—Ta—Ox. In this case, x is a real number. Also, x is a positive number and may not be zero. In addition, the formulae above are simplified and do not represent that the content of the first metal is equal to the content of the second metal.

A refractive index of Mo—Nb—Ox is about 1.70 and an absorption coefficient thereof may be about 0.53.

A content of the second metal may be about 3 wt % to 10 wt % with respect to the entire content of the blocking layer 126. When the content of the second metal is less than 3 wt %, deterioration of solubility by the second metal in water may not be expected, and when the expensive second metal is included with a content more than 10 w %, manufacturing cost and display panel cost may significantly increase.

The blocking layer 126 may have a thickness that induces destructive interference of external light, and may be derived from Equation 1.

$$D=\lambda/(4*n) \quad \text{Equation 1}$$

Here, d denotes a thickness of the blocking layer 126, $\lambda$ is a wavelength of external light that is incident on the display device 10, and n is a refractive index of the blocking layer 126. For example, the external light may have a wavelength of about 550 nm and a refractive index of the external light varies depending on the type of material included in the blocking layer 126, and thus a thickness d of the blocking layer 126 can be determined accordingly.

The gate line 121 may be manufactured by depositing a metal material that forms a metal layer, depositing a blocking material that forms the blocking layer, and then performing an etching process, for example, a dry-etching process. In this case, the metal material and the blocking material may be etched through the etching process, and the gate line 121 according to an exemplary embodiment of the present invention may be manufactured by performing one etching process.

The blocking material that forms the blocking layer 126 may include different metals such as the first metal and the second metal, but a deposition process using a single target may be used. Thus, the deposition process according to an exemplary embodiment of the present invention may be a non-reactive sputtering process. In the non-reactive sputtering process, oxygen ($O_2$) gas may not be used, and argon (Ar) gas may be used instead.

A cleaning process may be performed after performing the etching process, and when the cleaning process is performed, the blocking layer that includes the second metal may not be dissolved in the water used in the cleaning process. Accordingly, the gate line may be stably provided even though processes are iteratively performed.

The gate insulating layer 140 is provided on the gate line 121, a semiconductor layer 154 is provided on the gate insulating layer 140, and data lines 171 and a drain electrode 175 are provided on the semiconductor layer 154 in the y-axis direction. The data lines 171 include a source electrode 173.

The data lines 171 according to an exemplary embodiment of the present invention may include a metal layer 170 and a blocking layer 176. However, the present invention is not limited thereto. The drain electrode 175 that is manufactured through the same process as that of the data line 171 may also include a metal layer and a blocking layer.

The metal layer 170 includes a material having excellent electrical conductivity, and is provided between the gate insulating layer 140 and the blocking layer 176. The metal layer 170 may include, for example, at least one of aluminum (Al) and copper (Cu).

The blocking layer 176 is provided between the metal layer 170 and a passivation layer 180, and may contact the metal layer 170. That is, the blocking layer 176 is on top of the metal layer 170 which is above the substrate 110, for the top emission type display device.

The blocking layer 176 includes a metal having a high absorption coefficient, such that the blocking layer 176 may absorb external light and/or may destructively interfere with the external light. The blocking layer 176 may include a metal oxide.

The blocking layer 176 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layer 176 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

A refractive index of Mo—Nb—Ox is about 1.70 and an absorption coefficient thereof may be about 0.53.

A content of the second metal may be about 3 wt % to 10 wt % with respect to the entire content of the blocking layer 176. When the content of the second metal is less than 3 wt %, deterioration of solubility by the second metal in water may not be expected, and when the expensive second metal is included with a content more than 10 w %, manufacturing cost and display panel cost may significantly increase.

The blocking layer 176 may have a thickness that induces destructive interference of external light, and can be derived from Equation 1.

$$D=\lambda/(4*n) \quad \text{Equation 1}$$

Here, d denotes a thickness of the blocking layer 176, $\lambda$ is a wavelength of external light that is incident on the display device 10, and n is a refractive index of the blocking layer 176. For example, the external light may have a wavelength of about 550 nm and a refractive index of the external light varies depending on the type of material included in the blocking layer 176, and thus a thickness d of the blocking layer 176 can be determined accordingly.

The data line 171 may be manufactured by depositing a metal material that forms a metal layer, depositing a blocking material that forms the blocking layer, and then performing an etching process, for example, a dry-etching process. In this case, the metal material and the blocking material may be etched through the etching process, and the data line 171 according to an exemplary embodiment of the present invention may be manufactured by performing one etching process.

The blocking material that forms the blocking layer 176 may include different metals such as the first metal and the second metal, but a deposition process using a single target may be used. Thus, the deposition process according to an exemplary embodiment of the present invention may be a non-reactive sputtering process. In the non-reactive sputtering process, oxygen ($O_2$) gas may not be used, and argon (Ar) gas may be used instead.

A cleaning process may be performed after performing the etching process, and when the cleaning process is performed, the blocking layer that includes the second metal may not be dissolved in the water used in the cleaning process. Accordingly, the data line may be stably provided even though processes are iteratively performed.

A deposition process of an oxide layer that includes only the first metal requires a first target for depositing the first metal and injection of oxygen gas, and a process condition needs to be precisely controlled. For example, when the process condition such as a magnitude or intensity of a voltage applied during the deposition process is not precisely controlled, the oxide layer that includes the first metal may not be easily formed. Accordingly, the oxide layer that includes only the first metal is not appropriate for mass production.

As previously described, the blocking layers 126 and 176 are deposited by supplying stable argon gas and using a single target, and therefore it is possible to stably manufacture the blocking layers without being sensitive to the process condition.

The first metal included in the above-stated blocking layers 126 and 176 may reduce reflection of external light, which is reflected from the metal layers 120 and 170, and external light may be destructively interfered by being absorbed or through a relation with another layer. Thus, reflection of external light that cannot be blocked by a light blocking layer 220 may be suppressed by wires so that low reflection and enhanced display quality may be provided.

The blocking layers 126 and 176 that include the first metal may be manufactured through the same etching process as that used in etching the metal layers 120 and 170. Thus, when the blocking layers 126 and 176 are additionally formed on the metal layers 120 and 170, no manufacturing process is added, thereby providing a simple manufacturing process.

The metal layers 120 and 170 that include the second metal may have a property that is strong, e.g., resistant to water, with respect to a cleaning process. The blocking layer that includes only the first metal may be etched using the same etching process as that used in etching the metal layer, but the blocking layer may not be strong with respect to the cleaning process (e.g., water) and may be dissolved in water. However, the blocking layer may be prevented from being dissolved in water by including the second metal, thereby providing the gate line 121 and the data line 171 that are highly resistant to water in the cleaning process.

The gate line 121 and the data line 171 respectively include both the metal layer and the blocking layer in the above described exemplary embodiment, but the present invention is not limited thereto. For example, in an exemplary embodiment of the present invention, only the gate line 121 may include the metal layer and the blocking layer, or only the data line 171 may include the metal layer and the blocking layer.

The passivation layer 180 is provided on the data line 171 and the drain electrode 175, and a pixel electrode 191 that is physically and electrically connected with the drain electrode 175 through a contact hole 185 in the passivation layer 180 is provided on the passivation layer 180.

The semiconductor layer 154 that is provided on the gate electrode 124 forms a channel layer in an area that is exposed by the source electrode 173 and the drain electrode 175, and the gate electrode 124, the semiconductor layer 154, the source electrode 173, and the drain electrode 175 form a single thin film transistor.

The light blocking layer 220 and a color filter layer 230 included in the upper panel 200 are provided between a second substrate 210 and the liquid crystal layer 3, and a planarization layer 250 that provides a flat surface may be provided between the light blocking layer 220, the color filter layer 230, and the liquid crystal layer 3. In an exemplary embodiment of the present invention, the planarization layer 250 may be omitted. A common electrode 270 that receives a common voltage forms an electric field with the pixel electrode 191 to align a plurality of liquid crystal molecules 31 provided in the liquid crystal layer 3.

The liquid crystal layer 3 includes the plurality of liquid crystal molecules 31, and the liquid crystal molecules 31 are arranged in a direction that is determined by an electric field between the pixel electrode 191 and the common electrode 270. Transmittance of received light is controlled in accordance with the alignment of the liquid crystal molecules such that an image may be displayed.

The display device 10 may further include polarizers 12 and 22 (i.e., a first polarizer 12 and a second polarizer 22) that are disposed at opposite sides of the lower and upper panels 100 and 200, respectively. The first and second polarizers 12 and 22 may be one of a coating type of polarizer and a wire grid polarizer. The polarizers 12 and 22 may be provided at one side of each of the lower and upper panels 100 and 200, respectively, using various methods such as coating, attaching, and the like. However, such a description is exemplarily provided, and the present invention is not limited thereto.

Figure 4:
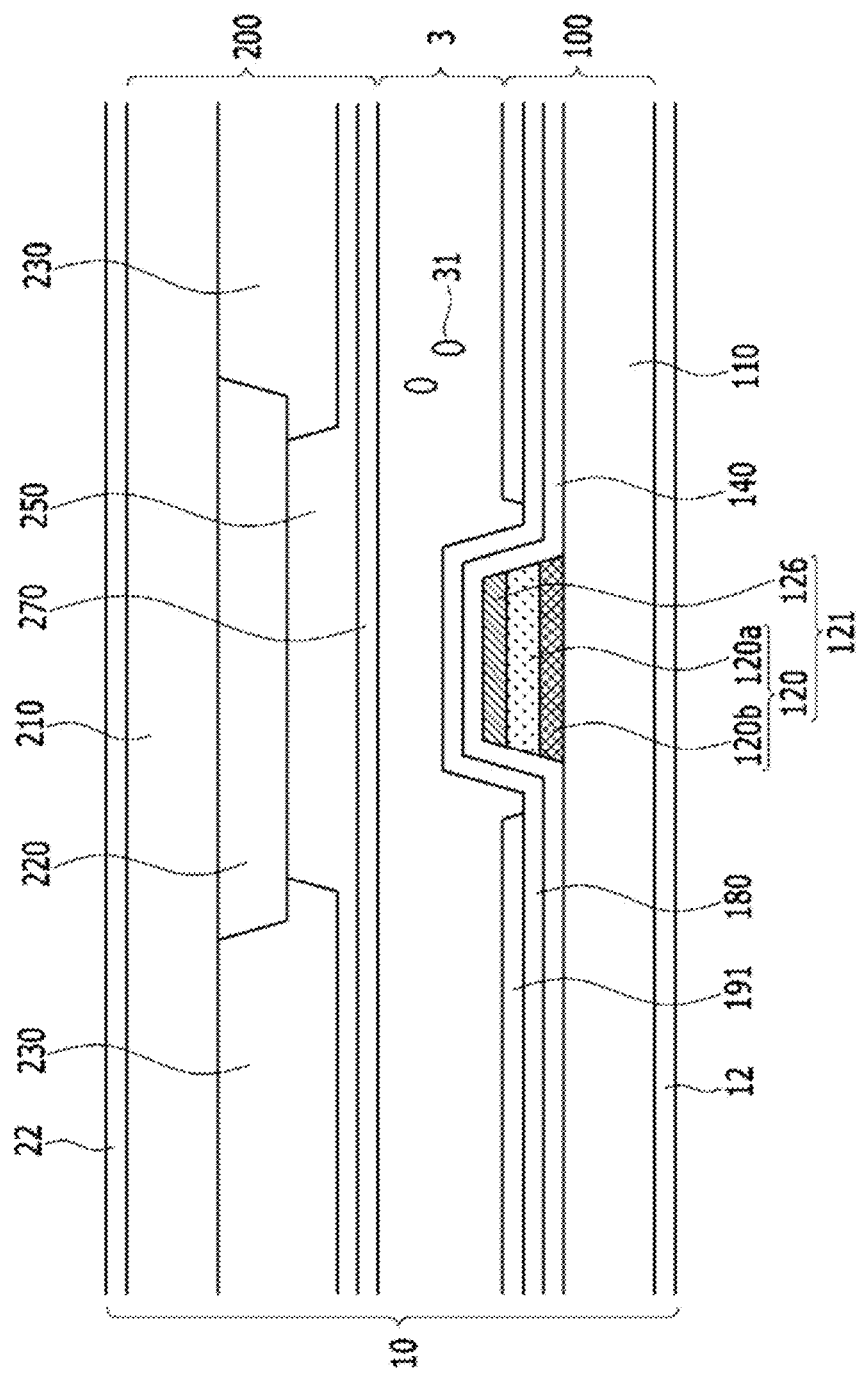
FIG. 4 is an exemplary variation of FIG. 2.
Figure 5:
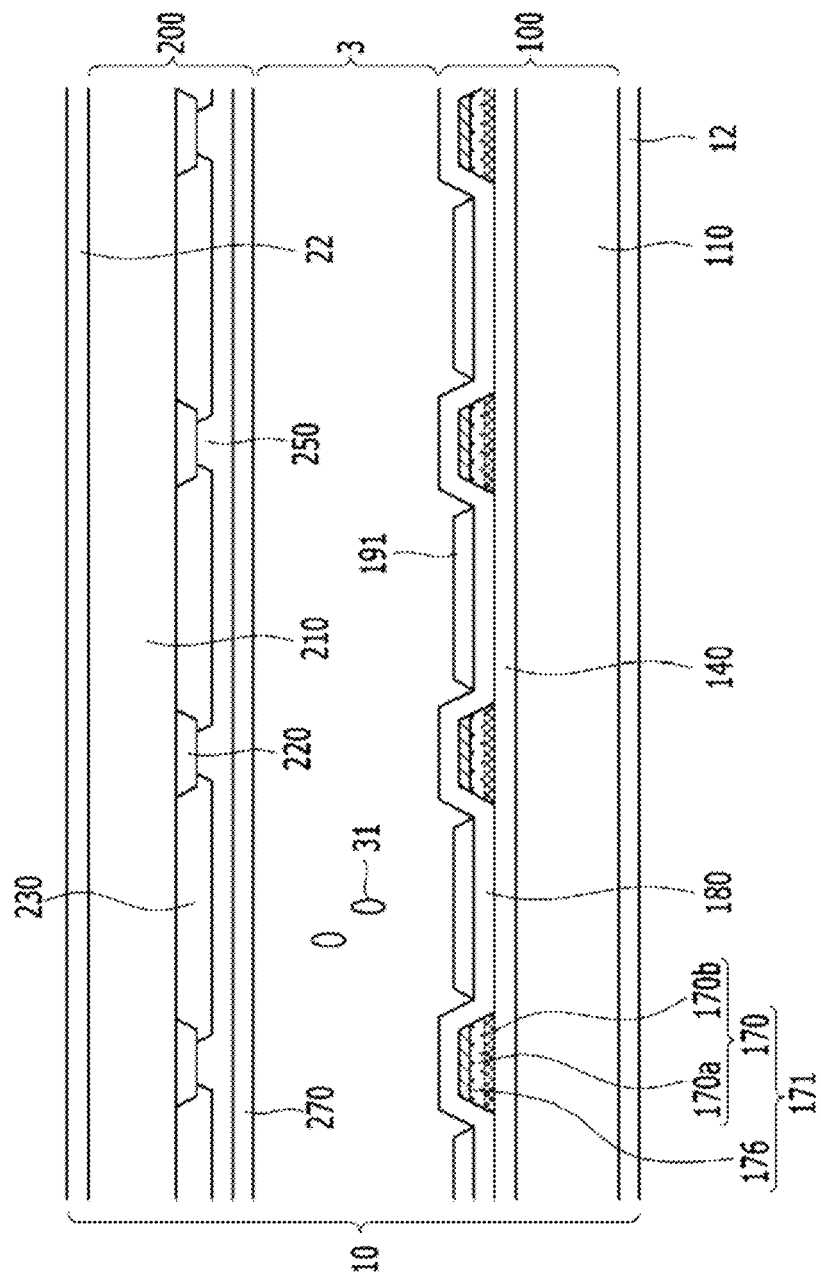
FIG. 5 is a cross-sectional view of an exemplary variation of FIG. 3.

Hereinafter, a display device according to an exemplary variation will be described with reference to FIG. 4 and FIG. 5. FIG. 4 is an exemplary variation of the exemplary embodiment of FIG. 2, and FIG. 5 is a cross-sectional view of the exemplary variation of the exemplary embodiment of FIG. 3. The same constituent elements as in the above-described exemplary embodiment will not be further described.

A display device 10 includes a lower panel 100, an upper panel 200 that overlaps the lower panel 100, and a liquid crystal layer 3 that is disposed between the lower panel 100 and the upper panel 200 and includes a plurality of liquid crystal molecules 31. The display device 10 according to the present exemplary embodiment may be a top emission type display device that emits light toward the upper panel 200 from the lower panel 100.

The lower panel 100 includes gate lines 121 including a gate electrode 124 provided on the first substrate 110 and extending in the x-axis direction.

The gate lines 121 include a metal layer 120 and a blocking layer 126, and the metal layer 120 according to the present exemplary embodiment includes a first layer 120a and a second layer 120b.

The first layer 120a may contact the blocking layer 126, and may be provided between the blocking layer 126 and the first substrate 110. The first layer 120a may include at least one of aluminum (Al) and copper (Cu) which have excellent electrical conductivity. The second layer 120b is provided between the first layer 120a and the first substrate 110, and may include titanium (Ti). The second layer 120b enables the first layer 120a to be easily deposited on the first substrate 110, and/or prevents permeation of moisture and the like into the first layer 120a.

The gate line 121 according to the present exemplary embodiment may include a multi-layered structure in which the second layer 120b, the first layer 120a, and the blocking layer 126 are sequentially stacked on the first substrate 110. In addition, the metal layer is provided as a double-layered structure in the present exemplary embodiment, but the present invention is not thereto. For example, the metal layer may include a multi-layered structure.

The blocking layer 126 is provided between the first layer 120a and a gate insulating layer 140 while contacting the metal layer 120, for example, the first layer 120a. The blocking layer 126 includes a metal having an absorption coefficient, such that the blocking layer 126 may absorb external light and/or destructively interfere with the external light. The blocking layer 126 may include a metal oxide.

The blocking layer 126 may include a first metal from one of a first group that includes molybdenum (Mo) and tungsten (W), a second metal from one of a second group that includes vanadium (V), niobium (Nb), zirconium (Zr), and tantalum (Ta), and oxygen (O). For example, the blocking layer 176 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

A content of the second metal may be about 3 wt % to 10 wt % with respect to the entire content of the blocking layer 126. When the content of the second metal is less than 3 wt %, deterioration of solubility by the second metal in water may not be expected, and when the expensive second metal is included with a content more than 10 w %, manufacturing cost and display panel cost may significantly increase.

The gate insulating layer 140 is provided on the gate line 121, a semiconductor layer 154 is provided on the gate insulating layer 140, and data lines 171 and a drain electrode 175 are provided on the semiconductor layer 154 in the y-axis direction. The data lines 171 include a source electrode 173.

The data line 171 may include a metal layer 170 and a blocking layer 176, and the metal layer 170 may include a first layer 170a and a second layer 170b. The data line 171 exemplarily includes the metal layer and the blocking layer in the present exemplary embodiment, but the present invention is not limited thereto. The drain electrode 175 manufactured through the same process as that of the data line 171 may also include a metal layer and a blocking layer. Further, although the metal layer 170 has a double-layered structure in the present exemplary embodiment, the metal layer 170 may have a two or more layered structure, i.e., a multi-layered structure.

The first layer 170a contacts the blocking layer 176, and is disposed between the gate insulating layer 140 and the blocking layer 176. The first layer 170a may include, for example, at least one of aluminum (Al) and copper (Cu) that have excellent electrical conductivity. The second layer 170b is disposed between the gate insulating layer 140 and the first layer 170a, and may include titanium (Ti).

With reference to the first substrate 110, the data lines 171 may have a multi-layered structure in which the second layer 170b, the first layer 170a, and the blocking layer 176 are sequentially stacked.

The blocking layer 176 is provided between the first layer 170a and a passivation layer 180 while contacting the metal layer 170, for example, the first layer 170a. The blocking layer 176 includes a metal having an absorption coefficient, such that the blocking layer 176 may absorb external light and/or destructively interfere with the external light. The blocking layer 176 may include a metal oxide.

The blocking layer 176 may include a first metal from one of a first group that includes molybdenum (Mo) and tungsten (W), a second metal from one of a second group that includes vanadium (V), niobium (Nb), zirconium (Zr), and tantalum (Ta), and oxygen (O). For example, the blocking layer 176 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

A content of the second metal may be about 3 wt % to 10 wt % with respect to the entire content of the blocking layer 176. When the content of the second metal is less than 3 wt %, deterioration of solubility by the second metal in water may not be expected, and when the expensive second metal is included with a content more than 10 w %, manufacturing cost and display panel cost may significantly increase.

The passivation layer 180 is provided on the data line 171 and the drain electrode 175, and a pixel electrode 191 that is physically and electrically connected with the drain electrode 175 through a contact hole 185 in the passivation layer 180 is provided on the passivation layer 180.

The light blocking layer 220 and a color filter layer 230 included in the upper panel 200 are provided between the second substrate 210 and the liquid crystal layer 3, and a planarization layer 250 that provides a flat surface is provided between the light blocking layer 220, the color filter layer 230, and the liquid crystal layer 3. In an exemplary embodiment of the present invention, the planarization layer 250 may be omitted. A common electrode 270 that receives a common voltage forms an electric field with the pixel electrode 191 to align a plurality of liquid crystal molecules 3 provided in the liquid crystal layer 3.

The display device 10 may further include polarizers 12 and 22 (i.e., a first polarizer 12 and a second polarizer 22) that are disposed at opposite sides of the lower and upper panels 100 and 200, respectively.

The gate line and the data line respectively include both the multi-layered metal layer and the blocking layer in the present exemplary embodiment, but the present invention is not limited thereto. For example, only the gate line may include the above-stated structure or only the data line may include the above-stated structure, or a combination with other exemplary embodiments of FIG. 1 to FIG. 3 is also possible.

Figure 6:
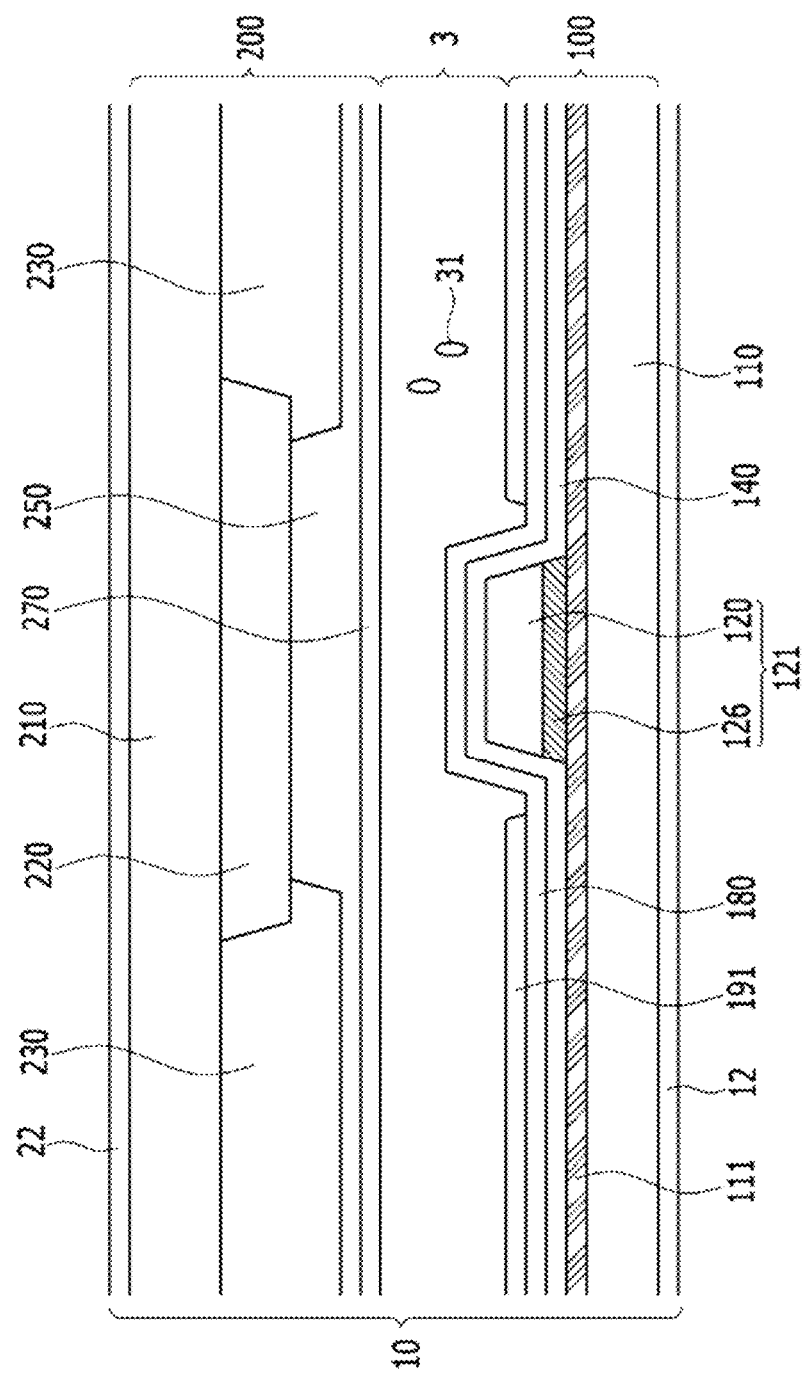
FIG. 6 is an exemplary variation of FIG. 2.
Figure 7:
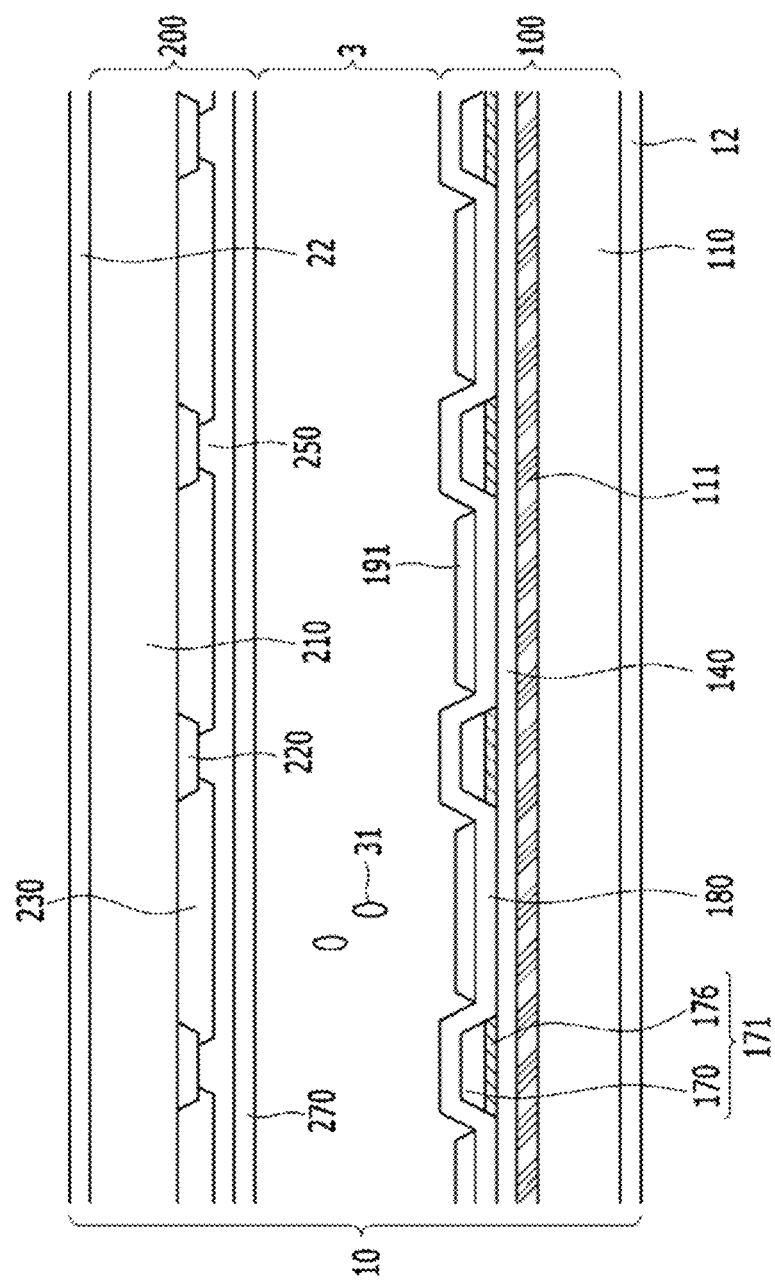
FIG. 7 is a cross-sectional view of an exemplary variation of FIG. 3.

Hereinafter, a display device according to an exemplary variation will be described with reference to FIG. 6 and FIG. 7. FIG. 6 is an exemplary variation of the exemplary embodiment of FIG. 2, and FIG. 7 is a cross-sectional view of the exemplary variation of FIG. 3. The same constituent elements as in the above-described exemplary embodiment will not be further described.

A display device 10 includes a lower panel 100, an upper panel 200 that overlaps the lower panel 100, and a liquid crystal layer 3 that is disposed between the lower panel 100 and the upper panel 200 and includes a plurality of liquid crystal molecules 31. The display device 10 according to the present exemplary embodiment may be a bottom emission type display device that emits light toward the lower panel 100 from the upper panel 200.

The lower panel 100 according to the present exemplary embodiment further includes an insulation layer 111 that is provided on the first substrate 110.

The insulation layer 111 may include one of silicon oxide (SiOx), silicon nitride (SiNy), silicon oxynitride (SiOxNy), titanium oxide ($TiO_2$), and aluminum oxide ($Al_2O_3$). In this case, x and y are real numbers. Also, x and y are positive numbers and may not be zero. The insulation layer 111 may contact a blocking layer 126, and the insulation layer 111 may have a predetermined refractive index for destructive inference of external light reflected from the insulation layer 111 and the blocking layer 126.

Gate lines 121 are provided on the insulation layer 111, and the gate lines 121 may include a blocking layer 126 and a metal layer 120.

The blocking layer 126 is provided between the insulation layer 111 and the metal layer 120, and includes a metal having an excellent absorption coefficient so that external light may be absorbed and/or destructively interfered with. The blocking layer 126 may include a metal oxide.

The blocking layer 126 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layer 126 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

The metal layer 120 is provided on the blocking layer 126, and may be disposed between the gate insulating layer 140 and the blocking layer 126. That is, the metal layer 120 is on top of the blocking layer 126 which is above the substrate 110, for the bottom emission type display device. The metal layer 120 may include, for example, at least one of aluminum (Al) and copper (Cu) which have excellent electrical conductivity.

The gate insulating layer 140 is provided on the gate line 121, a semiconductor layer 154 is provided on the gate insulating layer 140, and data lines 171 and a drain electrode 175 are provided on the semiconductor layer 154. The data lines 171 include a source electrode 173.

The data lines 171 include a blocking layer 176 and a metal layer 170. The data line 171 includes the blocking layer and the metal layer in the present exemplary embodiment, but the present invention is not limited thereto. The drain electrode 175 that is manufactured through the same process as that of the data line may also include a blocking layer and a metal layer.

The blocking layer 176 is disposed to be in contact with the metal layer 170, and as shown in FIG. 7, the blocking layer 176 may be disposed between the gate insulating layer 140 and the metal layer 170. The blocking layer 176 may include a metal having an excellent absorption coefficient so that external light may be absorbed and/or destructively interfered with. The blocking layer 176 may include a metal oxide.

The blocking layer 176 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layer 126 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

The metal layer 170 is provided on the blocking layer 176, and may be disposed between the blocking layer 176 and the passivation layer 180. That is, the metal layer 170 is on top of the blocking layer 176 which is above the substrate 110, for the bottom emission type display device. The metal layer 170 may include, for example, at least one of aluminum (Al) and copper (Cu) that have excellent electrical conductivity.

The passivation layer 180 is provided on the data line 171 and the drain electrode 175, and the pixel electrode 191 and the drain electrode 175 are connected with each other through a contact hole 185 included in the passivation layer 180.

A light blocking layer 220 and a color filter 230 included in the upper panel 200 are provided between the second substrate 210 and the liquid crystal layer 3, a planarization layer 250 that provides a flat surface may be provided between the light blocking layer 220, the color filter 230, and the liquid crystal layer 3, and a common electrode 270 may be provided between the planarization layer 250 and the liquid crystal layer 3. In an exemplary embodiment of the present invention, the planarization layer 250 may be omitted. The common electrode 270 that receives a common voltage forms an electric field with the pixel electrode 191 to align a plurality of liquid crystal molecules 31 that are provided in the liquid crystal layer 3.

The display device 10 may further include polarizers 12 and 22 that are provided at opposite sides of the lower and upper panels 100 and 200, respectively.

The present invention is not limited to the above described structures for the gate line and data line. For example, in the exemplary embodiment described with reference to FIG. 6 and FIG. 7, only the gate line may include the above-stated structure or only the data line may include the above-stated structure, or the exemplary embodiment of FIG. 6 and FIG. 7 may be combined with the exemplary embodiments described with reference to FIG. 1 to FIG. 5.

Figure 8:
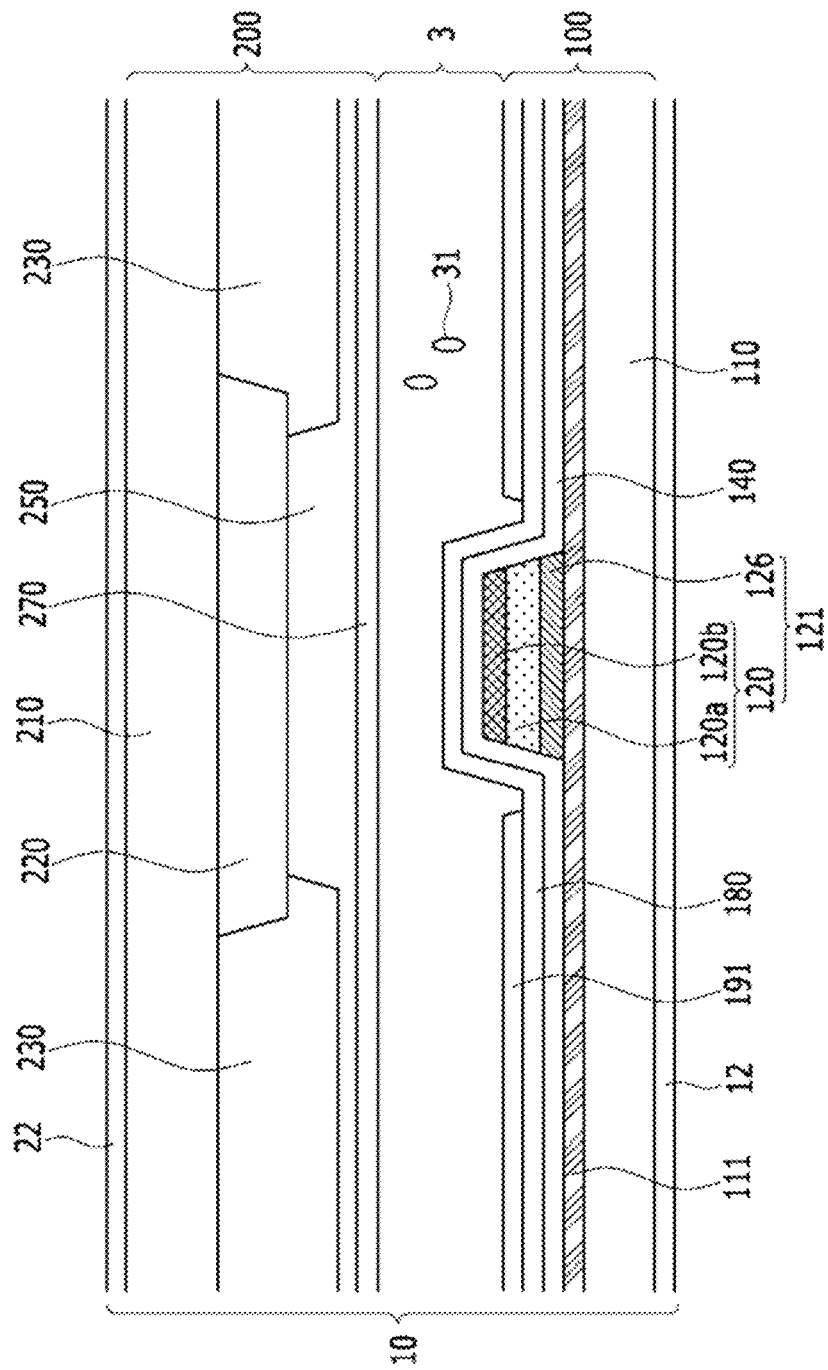
FIG. 8 is an exemplary variation of FIG. 2.
Figure 9:
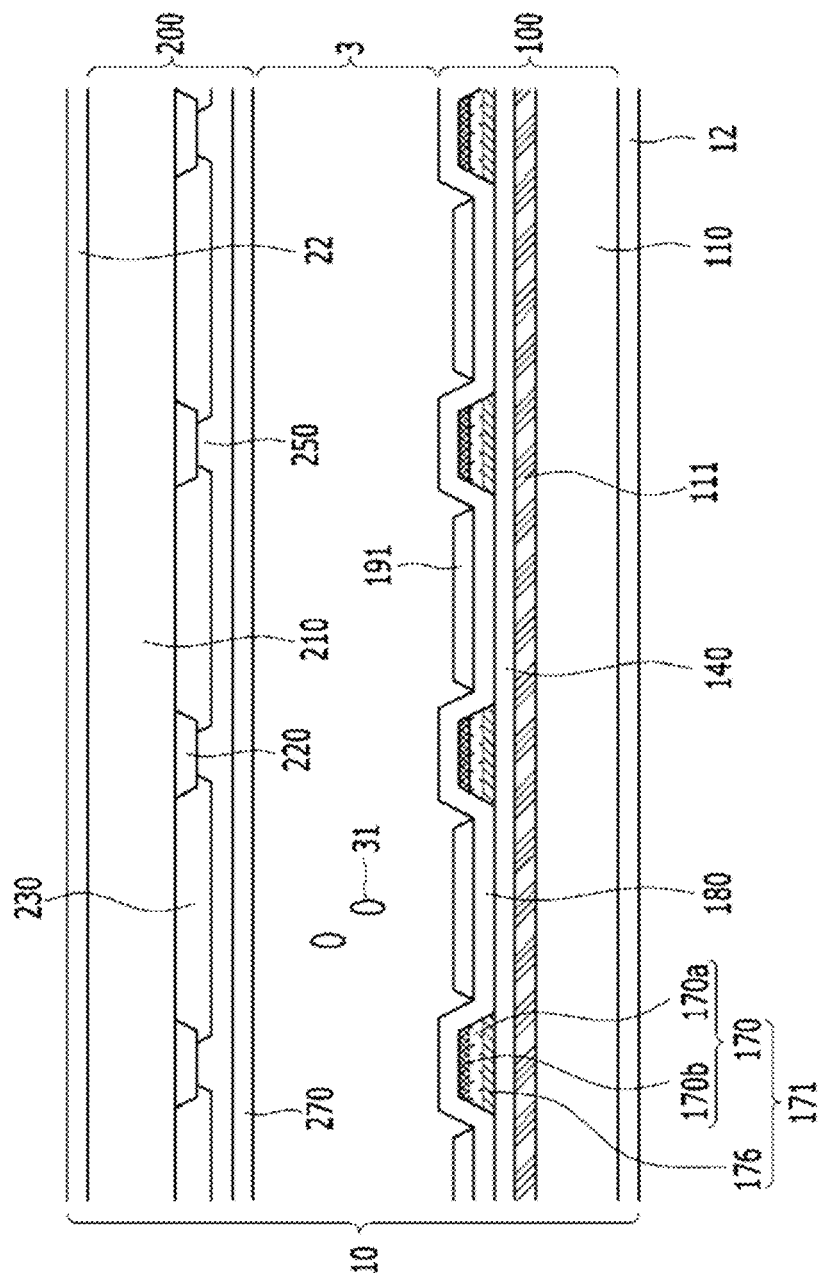
FIG. 9 is a cross-sectional view of an exemplary variation of FIG. 3.

Hereinafter, a display device according to an exemplary variation will be described with reference to FIG. 8 and FIG. 9. FIG. 8 is an exemplary variation of FIG. 2, and FIG. 9 is a cross-sectional view of an exemplary variation of FIG. 3. The same constituent elements as in the above-described exemplary embodiment will not be further described.

A display device 10 includes a lower panel 100, an upper panel 200 that overlaps the lower panel 100, and a liquid crystal layer 3 that is disposed between the lower panel 100 and the upper panel 200 and includes a plurality of liquid crystal molecules 31. The display device 10 according to the present exemplary embodiment may be a bottom emission type display device that emits light in a direction toward the lower panel 100 from the upper panel 200.

The lower panel 100 according to the present exemplary embodiment further includes an insulation layer 111 that is provided on the first substrate 110.

The insulation layer 111 may include one of SiOx, SiNy, SiOxNy, TiO$_2$, and Al$_2$O$_3$. The insulation layer 111 may contact a blocking layer 126, and the insulation layer 111 may have a predetermined refractive index for destructive inference of external light reflected from the insulation layer 111 and the blocking layer 126.

Gate lines 121 are provided on the insulation layer 111, the gate lines 121 may include a blocking layer 126 and a metal layer 120, and the metal layer 120 includes a first layer 120a and a second layer 120b. The metal layer 120 may have a multi-layer structure, and the metal layer 120 in the present exemplary embodiment has a double-layered structure, but the present invention is not limited thereto. For example, the metal layer 120 may have a multi-layered structure formed of two or more layers.

The blocking layer 126 is provided between the insulation layer 111 and the metal layer 120, and includes a metal having an excellent absorption coefficient so that external light may be absorbed and/or destructively interfered with. The blocking layer 126 may include a metal oxide.

The blocking layer 126 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layer 126 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

The first layer 120a of the metal layer 120 is provided on the blocking layer 126 and the second layer 120b of the metal layer 120 is disposed on the first layer 120a. The first layer 120a is provided between the second layer 120b and the blocking layer 126.

The first layer contacts the blocking layer 126, and may include, for example, at least one of aluminum (Al) and copper (Cu) which have excellent electrical conductivity.

The second layer 120b is provided between the first layer 120a and the gate insulating layer 140, and may include titanium (Ti). The second layer 120b may prevent permeation of an impurity or moisture into the first layer 120a.

The gate insulating layer 140 is provided on the gate line 121, a semiconductor layer 154 is provided on the gate insulating layer 140, and data lines 171 and a drain electrode 175 are provided on the semiconductor layer 154. The data lines 171 include a source electrode 173.

The data lines 171 include a blocking layer 176 and a metal layer 170, and the metal layer 170 includes a first layer 170a provided on the blocking layer 176 and a second layer 170b provided on the first layer 170a. The metal layer 170 may have a multi-layer structure, and the metal layer 170 in the present exemplary embodiment has a double-layered structure, but the present invention is not limited thereto. For example, the metal layer 170 may have a multi-layered structure formed of two or more layers.

The data line 171 includes the blocking layer and the metal layer in the present exemplary embodiment, but the present invention is not limited thereto. The drain electrode 175 that is manufactured through the same process as that of the data line may also include a blocking layer and a metal layer.

The blocking layer 176 is disposed to be in contact with the metal layer 170, for example, the first layer 170a, and is disposed between the first layer 170a and the gate insulating layer 140. The blocking layer 176 may include a metal having an excellent absorption coefficient so that external light may be absorbed and/or destructively interfered with. The blocking layer 176 may include a metal oxide.

The blocking layer 176 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layer 126 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

A content of the second metal may be about 3 wt % to 10 wt % with respect to the entire content of the blocking layer 176. When the content of the second metal is less than 3 wt %, deterioration of solubility by the second metal in water may not be expected, and when the expensive second metal is included with a content more than 10 w %, manufacturing cost and display panel cost may significantly increase.

The first layer 170a of the metal layer 170 is disposed on the blocking layer 176, and the second layer 170b of the metal layer 170 is disposed on the first layer 170a. The first layer 170a may include at least one of aluminum (Al) and copper (Cu), and the second layer 170b may include titanium (Ti).

A passivation layer 180 is provided on the data line 171 and the drain electrode 175, and the pixel electrode 191 and the drain electrode 175 are connected with each other through a contact hole 185 included in the passivation layer 180.

A light blocking layer 220 and a color filter 230 are provided between the second substrate 210 of the upper panel 200 and the liquid crystal layer 3, a planarization layer 250 that provides a flat surface is provided between the light blocking layer 220, the color filter 230, and the liquid crystal layer 3, while a common electrode 270 may be provided between the planarization layer 250 and the liquid crystal layer 3. In an exemplary embodiment of the present invention, the planarization layer 250 may be omitted. The common electrode 270 that receives a common voltage forms an electric field with the pixel electrode 191 to align a plurality of liquid crystal molecules 31 that are provided in the liquid crystal layer 3.

The display device 10 may further include polarizers 12 and 22 that are provided at opposite sides of the lower and upper panels 100 and 200, respectively.

The present invention is not limited to the above described structures for the gate line and data line. For example, in the exemplary embodiment described with reference to FIG. 8 and FIG. 9, only the gate line may include the above-stated structure or only the data line may include that above-stated structure, or the exemplary embodiment of FIG. 8 and FIG. 9 may be combined with the exemplary embodiments described with reference to FIG. 1 to FIG. 7.

Figure 10:
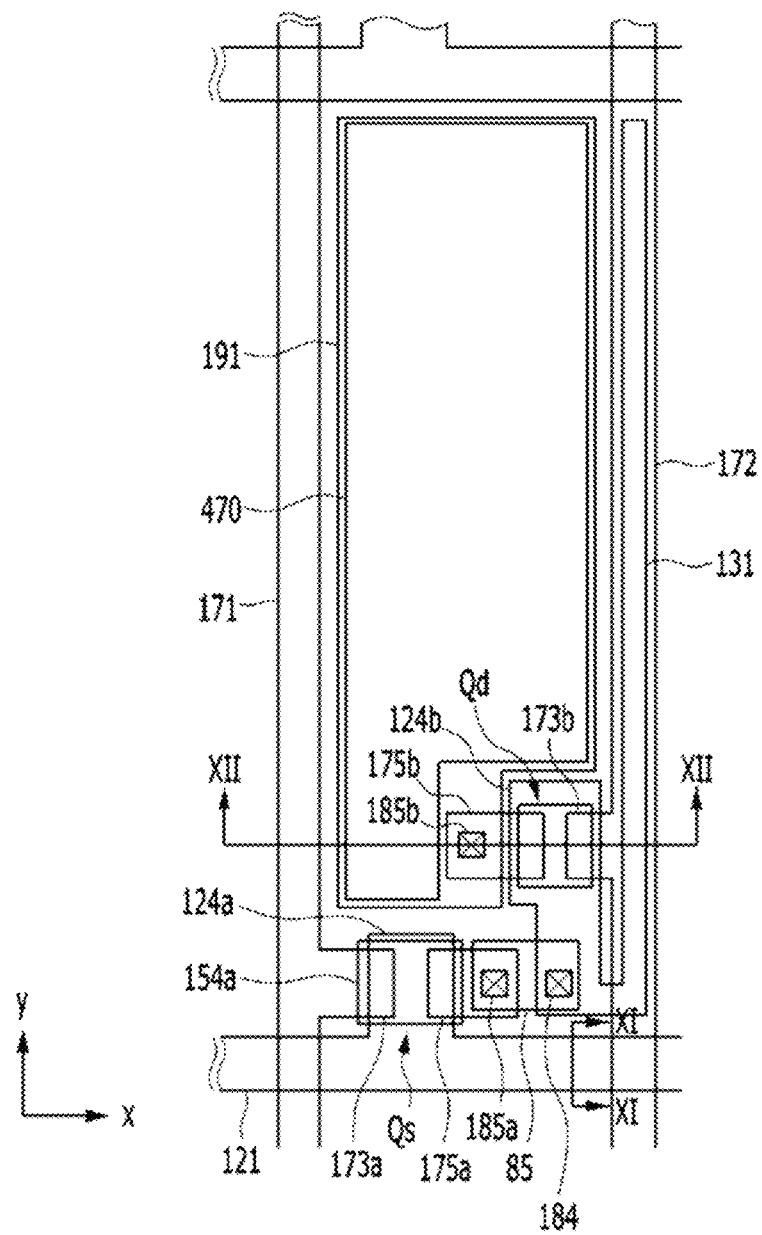
FIG. 10 is a top plan view of a pixel of a display device according to an exemplary embodiment of the present invention.
Figure 11:
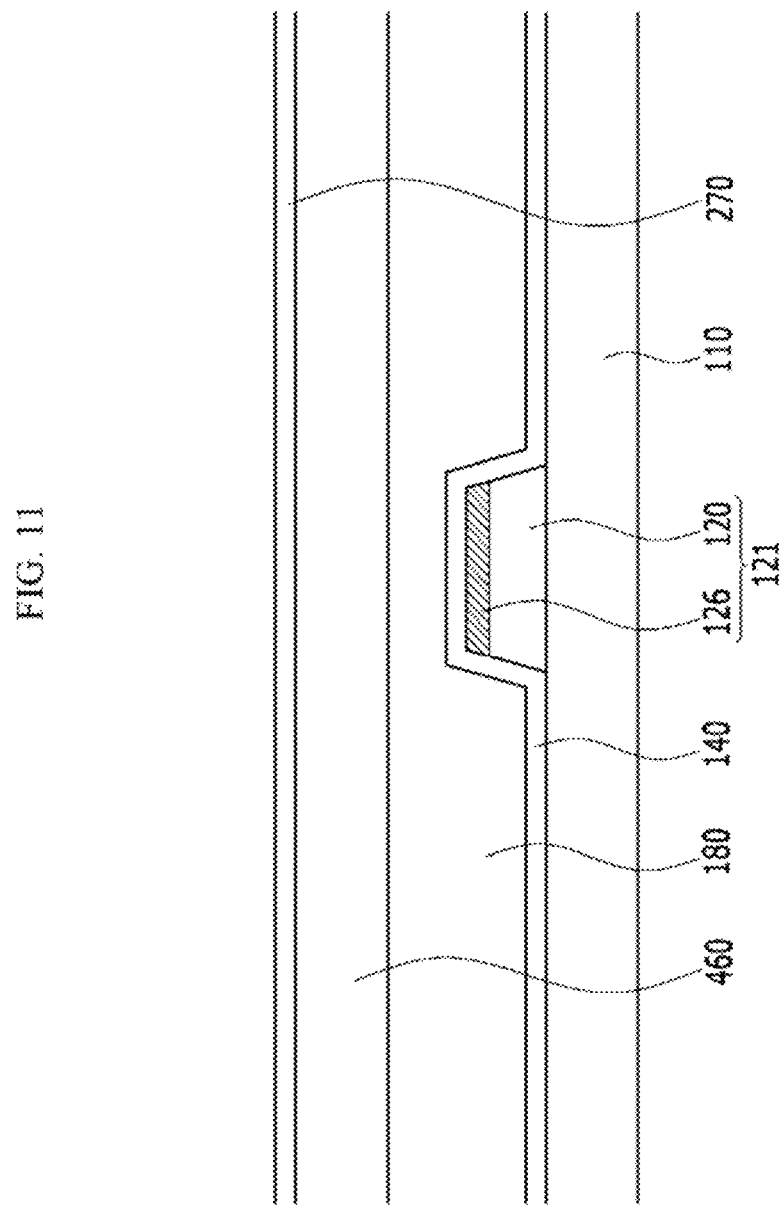
FIG. 11 is a cross-sectional view of FIG. 10, taken along line XI-XI.
Figure 12:
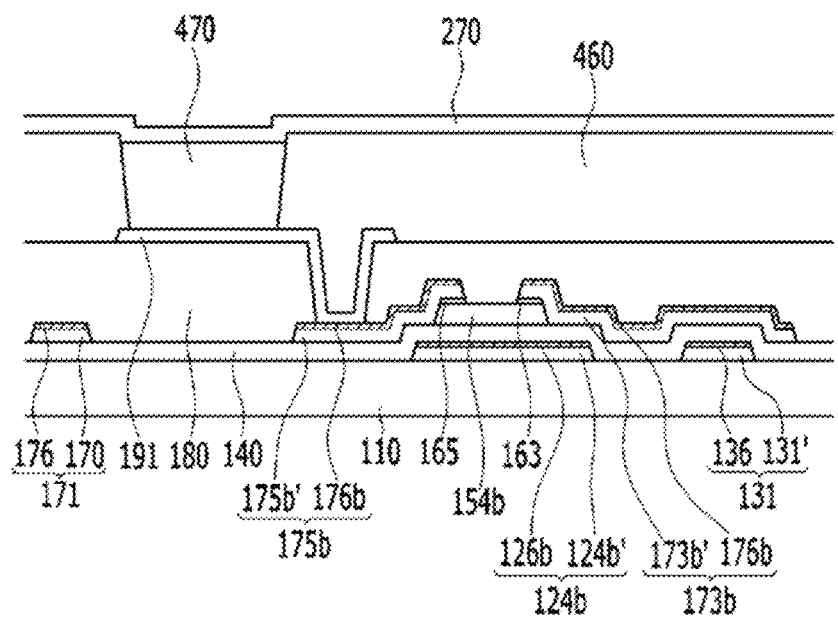
FIG. 12 is a cross-sectional view of FIG. 10, taken along line XII-XII.

FIG. 10 is a top plan view of a pixel of a display device according to an exemplary embodiment of the present invention, FIG. 11 is a cross-sectional view of FIG. 10, taken along line XI-XI, and FIG. 12 is a cross-sectional view of FIG. 10, taken along line XII-XII.

A display device shown in FIG. 10 to FIG. 12 is a top emission type display device that emits light in a direction toward a thin film transistor from a substrate 110.

The display device includes a gate conductor that includes a gate line 121 including a first gate electrode 124a, and a storage electrode line 131 including a second gate electrode 124b.

The gate conductors each may include metal layers 120, 124b', and 131' and blocking layers 126, 126b, and 136.

The metal layers 120, 124b', and 131' include a material having excellent electrical conductivity, and may include at least one of aluminum (Al) and copper (Cu).

The blocking layers 126, 126b, and 136 are disposed to be in contact with the metal layers 120, 124b', and 131', respectively, and are provided between the substrate 110 and a gate insulating layer 140, specifically, between the metal layers 120, 124b', and 131' and the gate insulating layer 140.

The blocking layers 126, 126b, and 136 include a metal having a high absorption coefficient so that external light may be absorbed and/or destructively interfered with. The blocking layers 126, 126b, and 136 may include a metal oxide.

The blocking layers 126, 126b, and 136 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layers 126, 126b, and 136 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

A content of the second metal may be about 3 wt % to 10 wt % with respect to the entire content of the blocking layers 126, 126b, and 136. When the content of the second metal is less than 3 wt %, deterioration of solubility by the second metal in water may not be expected, and when the expensive second metal is included with a content more than 10 w %, manufacturing cost and display panel cost may significantly increase.

The gate insulating layer 140 is provided on the gate conductor, a first semiconductor layer 154a and a second semiconductor layer 154b are provided on the gate insulating layer 140, and ohmic contacts 163 and 165 are provided on the first semiconductor layer 154a and the second semiconductor layer 154b.

A data line 171 including a first source electrode 173a, a driving voltage line 172 including a second source electrode 173b, and a data conductor including first and second drain electrodes 175a and 175b are provided on the ohmic contacts 163 and 165 and the gate insulating layer 140.

The data conductor may also include metal layers 170, 173b', and 175b' and blocking layers 176 and 176b.

The metal layers 170, 173b', and 175b' include a metal having excellent electrical conductivity, and may include at least one of aluminum (Al) and copper (Cu).

The blocking layers 176 and 176b are disposed between the metal layers 170, 173b', and 175b' and the passivation layer 180 while contacting the metal layers 170, 173b', and 175b', respectively. In this case, the blocking layer 176b is in contact with the metal layers 173*b*' and 175*b*'. The blocking layers 176 and 176*b* may include a material having a high absorption coefficient such that external light may be absorbed and/or destructively interfered with. The blocking layers 176 and 176*b* may include a metal oxide.

The blocking layers 176 and 176*b* may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layers 176 and 176*b* may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

A content of the second metal may be about 3 wt % to 10 wt % with respect to the entire content of the blocking layers 176 and 176*b*. When the content of the second metal is less than 3 wt %, deterioration of solubility by the second metal in water may not be expected, and when the expensive second metal is included with a content more than 10 w %, manufacturing cost and display panel cost may significantly increase.

The gate conductor and the data conductor respectively include both the metal layers and the blocking layers in the present exemplary embodiment, but the present invention is not limited thereto. For example, only the gate conductor may include the blocking layer or only the data conductor may include the blocking layer.

The passivation layer 180 is provided on the data conductors 171, 172, 173*a*, 173*b*, 175*a*, and 175*b*, the first semiconductor layer 154*a*, and an exposed portion of the second semiconductor layer 154*b*. The passivation layer 180 includes contact holes 185*a* and 185*b* that respectively expose the first drain electrode 175*a* and the second drain electrode 175*b*, and the passivation layer 180 and the gate insulating layer 140 include a contact hole 184 that exposes the second gate electrode 124*b*.

A pixel electrode 191 and a connection member 85 are provided on the passivation layer 180.

The pixel electrode 191 is connected with the second drain electrode 175*b* through the contact hole 185*b*, and the connection member 85 is connected with the second gate electrode 124*b* and the first drain electrode 175*a* through the contact holes 184 and 185*a*, respectively.

A barrier rib 460 is provided on the passivation layer 180, an organic light emission member 470 is provided in an opening that is provided between neighboring barrier ribs 460, and a common electrode 270 is provided on the organic light emission member 470.

The first gate electrode 124*a*, the first source electrode 173*a*, and the first drain electrode 175*a* form a switching thin film transistor Qs together with the first semiconductor layer 154*a*. The second gate electrode 124*b* that is connected to the first drain electrode 175*a*, the second source electrode 173*b*, and the second drain electrode 175*b* form a driving thin film transistor Qd together with the second semiconductor layer 154*b*, and a channel of the driving thin film transistor Qd is formed in the second semiconductor layer 154*b* between the second source electrode 173*b* and the second drain electrode 175*b*. The pixel electrode 191, the organic light emission member 470, and the common electrode 270 form an organic light emitting diode (OLED). The pixel electrode 191 may be an anode and the common electrode 270 may be a cathode, or the pixel electrode 191 may be a cathode and the common electrode 270 may be an anode.

The gate conductor and the data conductor respectively include both the metal layers and the blocking layers in the present exemplary embodiment, but the present invention is not limited thereto. For example, only the gate conductor may include the blocking layer or only the data conductor may include the blocking layer.

Figure 13:
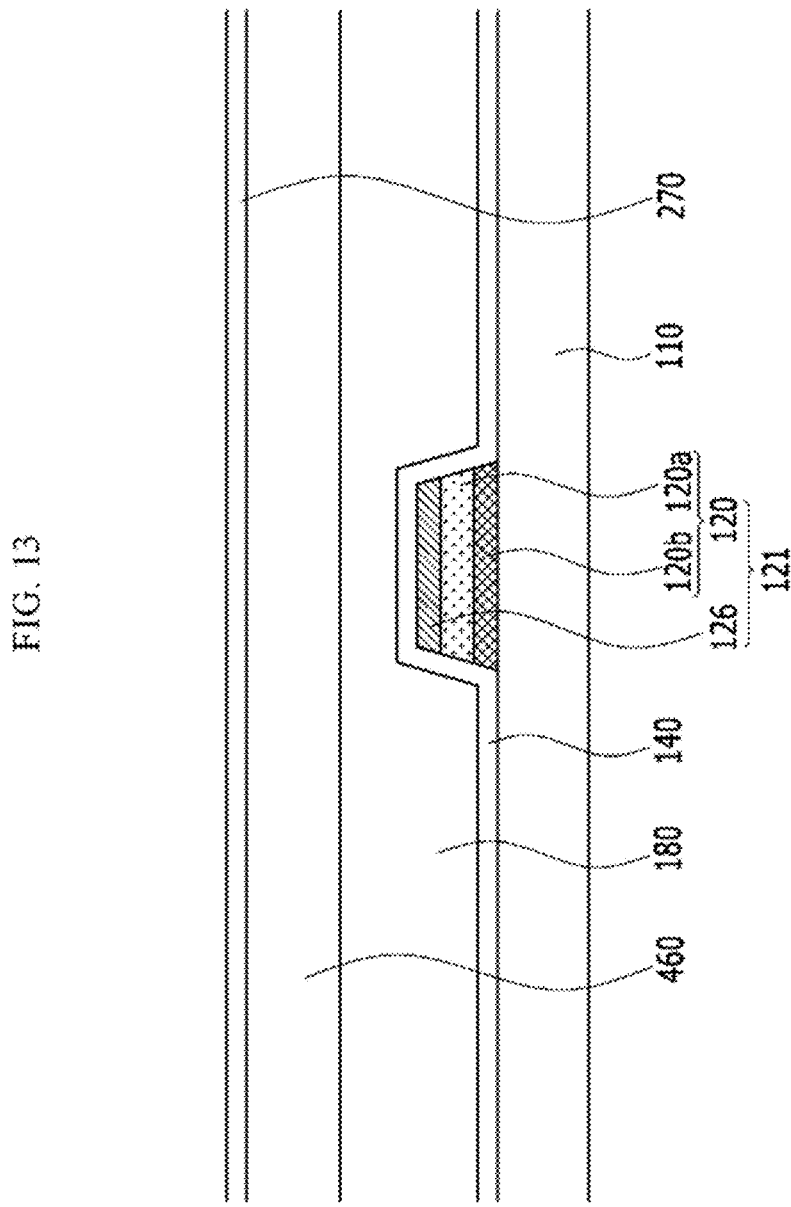
FIG. 13 is an exemplary variation of FIG. 11.

Hereinafter, a display device according to an exemplary variation will be described with reference to FIG. 10, FIG. 13, and FIG. 14. FIG. 13 is an exemplary variation of FIG. 11, and FIG. 14 is a cross-sectional view of an exemplary variation of FIG. 12.

Figure 14:
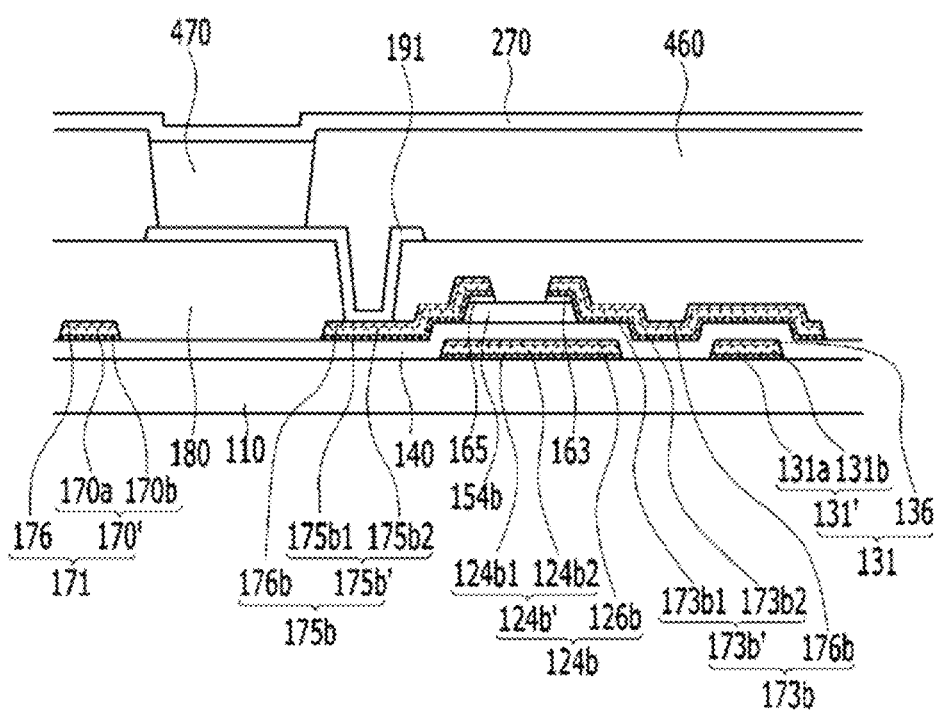
FIG. 14 is a cross-sectional view of an exemplary variation of FIG. 12.

A display device shown in FIG. 13 to FIG. 14 is a top emission type display device that emits light in a direction toward a thin film transistor from a substrate 110.

The display device includes gate conductors that are provided on the substrate 110 and include gate lines 121 and storage electrode lines 131. The gate lines 121 may include a first gate electrode 124*a* and the storage electrode lines 131 may include a second gate electrode 124*b*.

The gate conductors each may include metal layers 120, 124*b*', and 131' and blocking layers 126, 126*b*, and 136, and the metal layers 120, 124*b*', and 131' may include first layers 120*a*, 124*b*1, and 131*a* and second layers 120*b*, 124*b*2, and 131*b*, respectively.

The first layers 120*a*, 124*b*1, and 131*a* may contact the blocking layers 126, 126*b*, and 136, respectively, and may be provided between the blocking layers 126, 126*b*, and 136 and the substrate 110. The first layers 120*a*, 124*b*1, and 131*a* may include, for example, at least one of aluminum (Al) and copper (Cu), which have excellent electrical conductivity.

The second layers 120*b*, 124*b*2, and 131*b* are provided between the first layers 120*a*, 124*b*1, and 131*a* and the substrate 110, and may include titanium (Ti). The second layers 120*b*, 124*b*2, and 131*b* enable the first layers 120, 124*b*1, and the 131*a* to be easily deposited on the substrate 110 or prevent permeation of moisture and the like into the first layers 120*a*, 124*b*1, and 131*a*, respectively.

With reference to the substrate 110, the gate conductors according to the present exemplary embodiment may have a multi-layered structure in which the second layers 120*b*, 124*b*2, and 131*b*, the first layers 120*a*, 124*b*1, and 131*a*, and the blocking layers 126, 126*b*, and 136 are sequentially stacked, respectively. The metal layer has a double-layered structure in the present exemplary embodiment, but the present invention is not limited thereto. For example, the metal layer may have a multi-layered structure in which two or more layers are stacked.

A gate insulating layer 140 is provided on the gate conductors, a first semiconductor layer 154*a* and a second semiconductor layer 154*b* are provided on the gate insulating layer 140, and ohmic contacts 163 and 165 are provided on the first semiconductor layer 154*a* and the second semiconductor layer 154*b*.

Data conductors that include data lines 171 that include a first source electrode 173*a*, driving voltage lines 172 that include a second source electrode 173*b*, and first and second drain electrodes 175*a* and 175*b* are provided on the ohmic contacts 163 and 165 and the gate insulating layer 140.

The data conductor may include metal layers 170', 175*b*', and 173*b*' and blocking layers 176 and 176*b*, and the metal layers 170', 175*b*', and 173*b*' may include first layers 170*a*, 175*b*1, and 173*b*1 and second layers 170*b*, 175*b*2, and 173*b*2, respectively. The metal layers 170', 175*b*', and 173*b*' may be formed with a multi-layer structure, and the metal layer in the present exemplary embodiment exemplarily includes a double-layered structure, but the present invention is not limited thereto. For example, the metal layer may have a multi-layered structure in which two or more layers are stacked.

The gate conductor and the data conductor respectively include both the metal layers and the blocking layers in the present exemplary embodiment, but the present invention is not limited thereto. For example, only the gate conductor may include the blocking layer or only the data conductor may include the blocking layer.

The first layers 170a, 175b1, and 173b1 contact the blocking layers 176, and 176b, respectively, and are provided between the gate insulating layer 140 and the blocking layers 176 and 176b. In this case, the blocking layer 176b is in contact with the first layers 175b1 and 173b1. The first layers 170a, 175b1, and 173b1 may include, for example, at least one of aluminum (Al) and copper (Cu), which have excellent electrical conductivity.

The second layers 170b, 175b2, and 173b2 are provided between the gate insulating layer 140 and the first layers 170a, 175b1, and 173b1, respectively, and may include titanium (Ti).

With reference to the substrate 110, the data conductors according to the present exemplary embodiment may have a multi-layered structure in which the second layers 170b, 175b2, and 173b2, the first layers 170a, 175b1, and 173b1, and the blocking layers 176 and 176b are sequentially stacked, respectively.

The blocking layers 176 and 176b contact the metal layers 170', 175b', and 173b', and are provided between the passivation layer 180 and the metal layers 170', 175b', and 173b'. The blocking layers 176 and 176b may include a metal having a high absorption coefficient such that external light may be absorbed and/or destructively interfered with. The blocking layers 176 and 176b may include a metal oxide.

The blocking layers 176 and 176b may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layers 176 and 176b may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

A content of the second metal may be about 3 wt % to 10 wt % with respect to the entire content of the blocking layers 176 and 176b. When the content of the second metal is less than 3 wt %, deterioration of solubility by the second metal in water may not be expected, and when the expensive second metal is included with a content more than 10 w %, manufacturing cost and display panel cost may significantly increase.

The passivation layer 180 is provided on the data conductors 171, 172, 173a, 173b, 175a, and 175b, the first semiconductor layer 154a, and an exposed portion of the second semiconductor layer 154b. The passivation layer 180 includes contact holes 185a and 185b that respectively expose a first drain electrode 175a and a second drain electrode 175b, and the passivation layer 180 and the gate insulating layer 140 include a contact hole 184 that exposes the second gate electrode 124b.

A pixel electrode 191 and a connection member 85 are provided on the passivation layer 180. The pixel electrode 191 is connected with the second drain electrode 175b through the contact hole 185b, and the connection member 85 is connected with the second gate electrode 124b and the first drain electrode 175a through the contact holes 184 and 185a.

A barrier rib 460 is provided on the passivation layer 180, and an organic light emission member 470 is provided in an opening that is provided between neighboring barrier ribs 460. A common electrode 270 is provided on the organic light emission member 470.

The first gate electrode 124a, the first source electrode 173a, and the first drain electrode 175a form a switching thin film transistor Qs together with the first semiconductor layer 154a. The second gate electrode 124b that is connected to the first drain electrode 175a, the second source electrode 173b, and the second drain electrode 175b form a driving thin film transistor Qd together with the second semiconductor layer 154b, and a channel of the driving thin film transistor Qd is formed in the second semiconductor layer 154b between the second source electrode 173b and the second drain electrode 175b.

Figure 15:
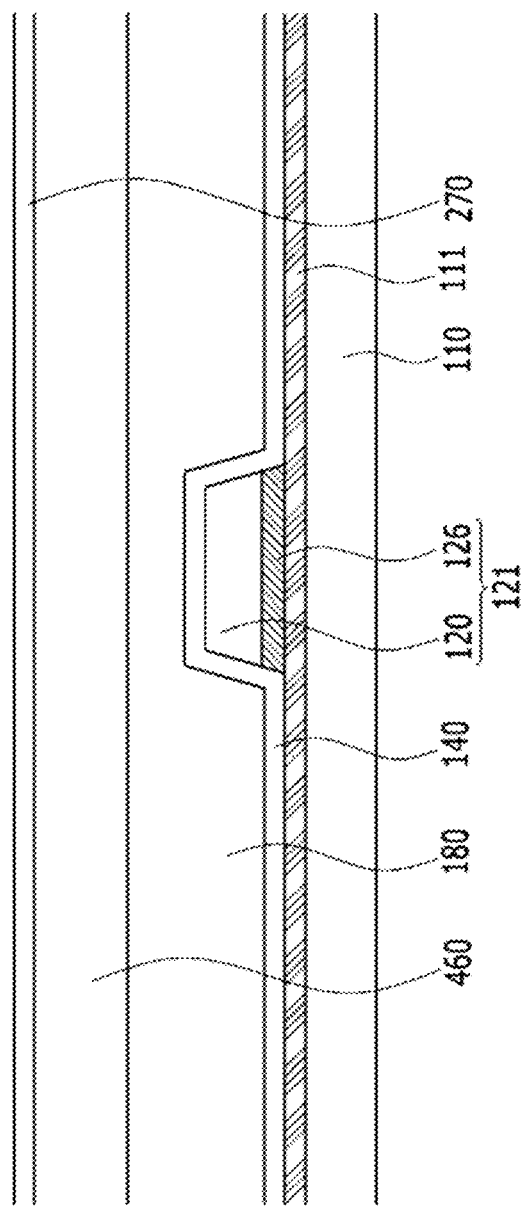
FIG. 15 is an exemplary variation of FIG. 11.
Figure 16:
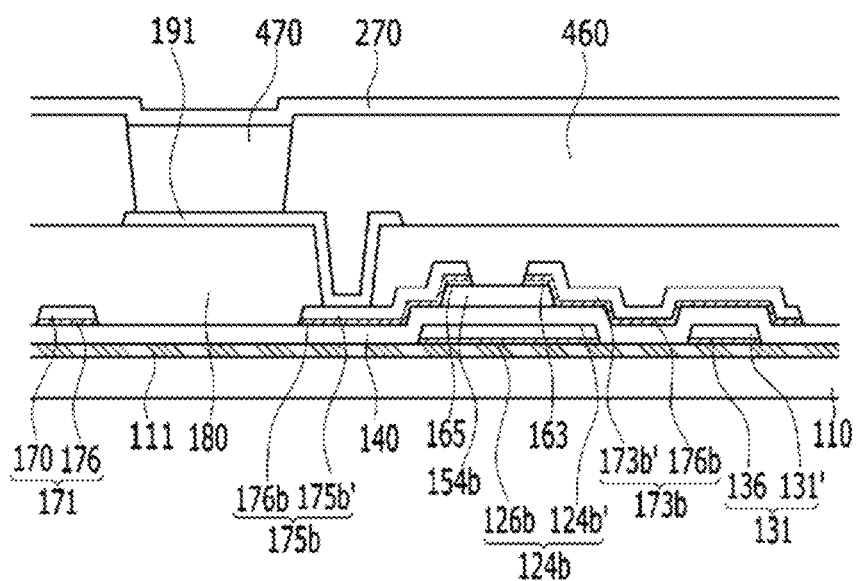
FIG. 16 is a cross-sectional view of an exemplary variation of FIG. 12.

Hereinafter, a display device according to an exemplary embodiment will be described with reference to FIG. 10, FIG. 15 and FIG. 16. FIG. 15 is an exemplary variation of FIG. 11, and FIG. 16 is a cross-sectional view of an exemplary variation of FIG. 12. A display device according to the present exemplary embodiment is a bottom emission type display device that emits light in a direction toward a substrate 110 from a thin film transistor.

The display device according to the present exemplary embodiment further includes an insulation layer 111 that is provided on the substrate 110.

The insulation layer 111 may include one of SiOx, SiNy, SiOxNy, $TiO_2$, and $Al_2O_3$. The insulation layer 111 may contact blocking layers 126, 126b, and 136, and may have a predetermined refractive index for destructive interference of external light that is transmitted from the substrate 110 and then reflected through the insulation layer 111 and the blocking layers 126, 126b, and 136.

Gate conductors that include gate lines 121 that include a first gate electrode 124a and storage electrode lines 131 that include a second gate electrode 124b are provided on the insulation layer 111, and each of the gate conductors includes the blocking layers 126, 126b, and 136 and metal layers 120, 124b', and 131'.

The blocking layers 126, 126b, and 136 contact the metal layers 120, 124b', and 131', respectively, and are provided between the metal layers 120, 124b', and 131' and the insulation layer 111. The blocking layers 126, 126b, and 136 include a metal having a high absorption coefficient so that external light may be absorbed and/or destructively interfered with. The blocking layers 126, 126b, and 136 may include a metal oxide.

The blocking layers 126, 126b, and 136 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layers 126, 126b, and 136 may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

The metal layers 120, 124b', and 131' are provided between a gate insulating layer 140 and the substrate 110 while contacting the blocking layers 126, 126b, and 136, respectively. The metal layers 120, 124b', and 131' may include a metal having excellent electrical conductivity, and may include at least one of aluminum (Al) and copper (Cu).

The gate conductors according to the present exemplary embodiment may include a structure in which the insulation layer 111, the blocking layers 126, 126b, and 136, and the metal layers 120, 124b', and 131' are sequentially stacked on the substrate 110, respectively. The gate insulating layer 140 is provided on the gate conductors, a first semiconductor layer 154a and a second semiconductor layer 154b are provided on the gate insulating layer 140, and ohmic contacts 163 and 165 are provided on the first semiconductor layer 154a and the second semiconductor layer 154b. In an exemplary embodiment of the present invention, the ohmic contacts 163 and 165 may be omitted.

Data conductors that include data lines 171 that include a first source electrode 173a, driving voltage lines 172 that include a second source electrode 173b, and first and second drain electrodes 175a and 175b are provided on the ohmic contacts 163 and 165 and the gate insulating layer 140.

The data conductors each include blocking layers 176 and 176b and metal layers 170, 173b', and 175b'. The gate conductor and the data conductor respectively include the metal layers and the blocking layers in the present exemplary embodiment, but the present invention is not limited thereto. For example, only the gate conductor may include the blocking layer or only the data conductor may include the blocking layer.

The blocking layers 176 and 176b contact the metal layers 170, 173b', and 175b', respectively, and are provided between the gate insulating layer 140 and the metal layers 170, 173b', and 175b'. In this case, the blocking layer 176b is in contact with the metal layers 173b' and 175b'. The blocking layers 176 and 176b may include a metal having a high absorption coefficient, such that external light may be absorbed and/or destructively interfered with. The blocking layers 176 and 176b may include a metal oxide.

The blocking layers 176 and 176b may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layers 176 and 176b may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

The metal layers 170, 173b', and 175b' are provided on the blocking layers 176 and 176b and are disposed between the passivation layer 180 and the blocking layers 176 and 176b. The metal layers 170, 173b', and 175b' may include at least one of aluminum (Al) and copper (Cu), which have excellent electrical conductivity.

A passivation layer 180 is provided on the data conductors 171, 172, 173a, 173b, 175a, and 175b, the first semiconductor layer 154a, and an exposed portion of the second semiconductor layer 154b. The passivation layer 180 includes contact holes 185a and 185b that respectively expose the first drain electrode 175a and the second drain electrode 175b, and the passivation layer 180 and the gate insulating layer 140 have a contact hole 184 that exposes the second gate electrode 124b.

A pixel electrode 191 and a connection member 85 are provided on the passivation layer 180. The pixel electrode 191 is connected with the second drain electrode 175b through the contact hole 185b, and the connection member 85 is connected with the second gate electrode 124b and the first drain electrode 175a through the contact holes 184 and 185a.

A barrier rib 460 is provided on the passivation layer 180, and an organic light emission member 470 is provided in an opening between neighboring barrier ribs 460. A common electrode 270 is provided on the organic light emission member 470.

The first gate electrode 124a, the first source electrode 173a, and the first drain electrode 175a form a switching thin film transistor Qs together with the first semiconductor layer 154a. The second gate electrode 124b that is connected to the first drain electrode 175a, the second source electrode 173b, and the second drain electrode 175b form a driving thin film transistor Qd together with the second semiconductor layer 154b, and a channel of the driving thin film transistor Qd is formed in the second semiconductor layer 154b between the second source electrode 173b and the second drain electrode 175b.

Figure 17:
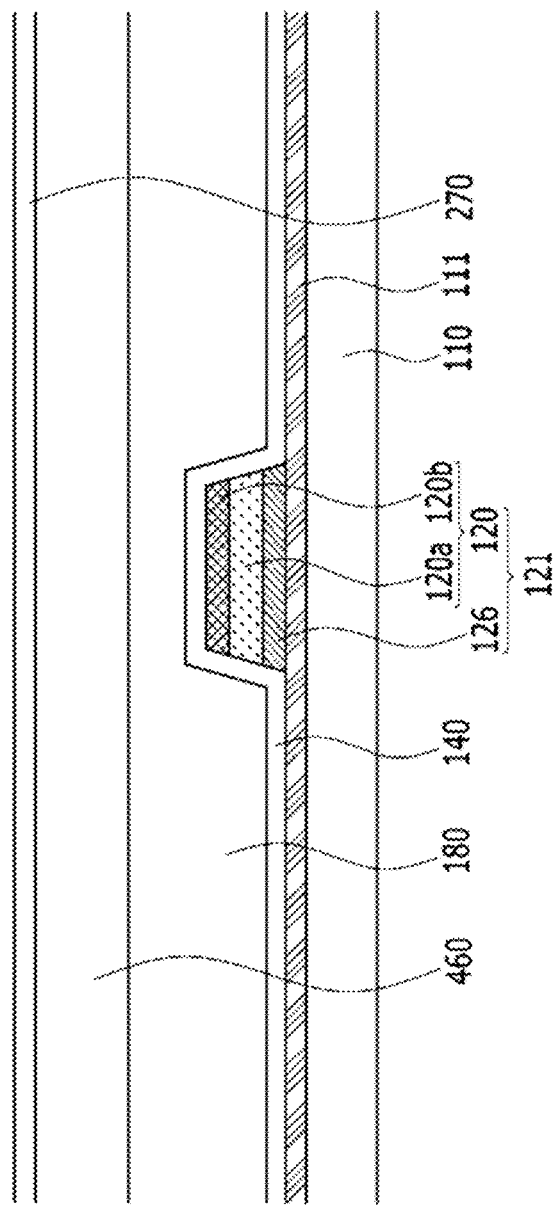
FIG. 17 is an exemplary variation of FIG. 11.
Figure 18:
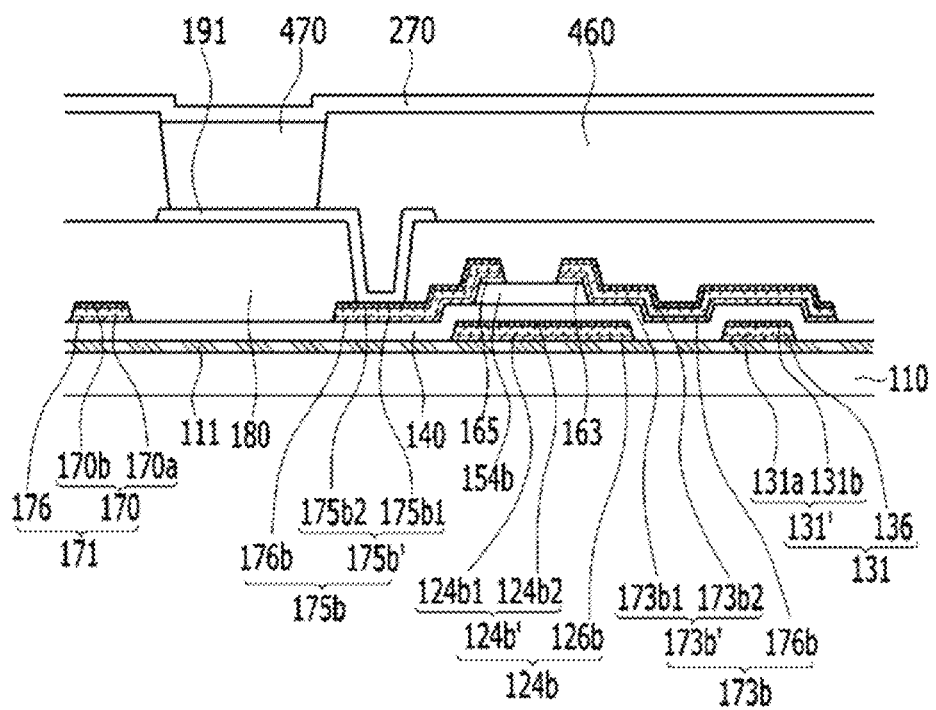
FIG. 18 is a cross-sectional view of an exemplary variation of FIG. 12.

Hereinafter, a display device according to an exemplary embodiment of the present invention will be described with reference to FIG. 17 and FIG. 18. FIG. 17 is an exemplary variation of FIG. 11, and FIG. 18 is a cross-sectional view of an exemplary variation of FIG. 12. A display device according to the present exemplary embodiment is a bottom emission type display device that emits light in a direction toward a substrate 110 from a thin film transistor.

The display device according to the present exemplary embodiment further includes an insulation layer 111 that is provided on the substrate 110.

The insulation layer 111 may include one of SiOx, SiNy, SiOxNy, $TiO_2$, and $Al_2O_3$. The insulation layer 111 may contact a blocking layer 126, and may have a predetermined refractive index for destructive interference of external light that is transmitted from the substrate 110 and then reflected through the insulation layer 111 and the blocking layer 126.

Gate conductors that include gate lines 121 that include a first gate electrode 124a and storage electrode lines 131 that include a second gate electrode 124b are provided on the insulation layer 111, and each of the gate conductors includes blocking layers 126, 126b, and 136 and metal layers 120, 124b', and 131', and the metal layers 120, 124b', and 131' include first layers 120a, 124b1, and 131a and second layers 120b, 124b2, and 131b, respectively. The metal layer has a double-layered structure in the present exemplary embodiment, but the present invention is not limited thereto. For example, the metal layer may have a multi-layered structure in which two or more layers are stacked.

The blocking layers 126, 126b, and 136 contact the metal layers 120, 124b', and 131', respectively, and are provided between the metal layers 120, 124b', and 131' and the insulation layer 111. The blocking layers 126, 126b, and 136 may include a metal having a high absorption coefficient, such that external light may be absorbed and/or destructively interfered with. The blocking layers 126, 126b, and 136 may include a metal oxide.

The blocking layers 126, 126b, and 136 may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layers 176 and 176b may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

The metal layers 120, 124b', and 131' may include first layers 120a, 124b1, and 131a that are provided on the blocking layers 126, 126b, and 136, and second layers 120b, 124b2, and 131b that are provided on the first layers 120a, 124b1, and 131a, respectively. The first layers 120a, 124b1, and 131a contact the blocking layers 126, 126b, and 136, respectively, and may include at least one of aluminum (Al) and copper (Cu), which have excellent electrical conductivity.

The second layers 120b, 124b2, and 131b are provided between the first layers 120a, 124b1, and 131a and the gate insulating layer 140, and may include titanium (Ti). The second layers 120b, 124b2, and 131b prevent permeation of an impurity or moisture and the like into the first layers 120a, 124b1, and 131a, respectively.

The gate insulating layer 140 is provided on the gate conductors, a first semiconductor layer 154a and a second semiconductor layer 154b are provided on the gate insulating layer 140, and ohmic contacts 163 and 165 are provided on the first semiconductor layer 154a and the second semiconductor layer 154b. In an exemplary embodiment of the present invention, the ohmic contacts 163 and 165 may be omitted.

Data conductors that include data lines 171 that include a first source electrode 173a, driving voltage lines 172 that include a second source electrode 173b, and first and second drain electrodes 175a and 175b are provided on the ohmic contacts 163 and 165 and the gate insulating layer 140.

The data conductors each includes blocking layers 176 and 176b and metal layers 170, 173b', and 175b', and the metal layers 170, 173b', and 175b' include first layers 170a, 173b1, and 175b1 and second layers 170b, 173b2, and 175b2, respectively.

The gate conductor and the data conductor respectively include both the metal layers and the blocking layers in the present exemplary embodiment, but the present invention is not limited thereto. For example, only the gate conductor may include the blocking layer or only the data conductor may include the blocking layer.

The blocking layers 176 and 176b contact the metal layers 170, 173b', and 175b', respectively, and are provided between the gate insulating layer 140 and the metal layers 170, 173b', and 175b'. In this case, the blocking layer 176b is in contact with the metal layers 173b' and 175b'. The blocking layers 176 and 176b may include a metal having a high absorption coefficient, such that external light may be absorbed and/or destructively interfered with. The blocking layers 176 and 176b may include a metal oxide.

The blocking layers 176 and 176b may include a first metal from one of a first group including molybdenum (Mo) and tungsten (W), a second metal from one of a second group including vanadium (V), niobium (Nb), zirconium (Zr), and tantalum (Ta), and oxygen (O). For example, the blocking layers 176 and 176b may include one of Mo—V—Ox, Mo—Nb—Ox, Mo—Zr—Ox, Mo—Ta—Ox, W—V—Ox, W—Nb—Ox, W—Zr—Ox, and W—Ta—Ox.

The metal layers 170, 173b', and 175b' may include first layers 170a, 173b1, and 175b1 that are provided on the blocking layers 176 and 176b, and second layers 170b, 173b2, and 175b2 that are provided on the first layers 170a, 173b1, and 175b1, respectively.

The first layers 170a, 173b1, and 175b1 may include at least one of aluminum (Al) and copper (Cu), and the second layers 170b, 173b2, and 175b2 may include titanium (Ti).

A passivation layer 180 is provided on the data conductors 171, 172, 173a, 173b, 175a, and 175b, the first semiconductor layer 154a, and an exposed portion of the second semiconductor layer 154b. The passivation layer 180 includes contact holes 185a and 185b that respectively expose the first drain electrode 175a and the second drain electrode 175b, and the passivation layer 180 and the gate insulating layer 140 have a contact hole 184 that exposes the second gate electrode 124b.

A pixel electrode 191 and a connection member 85 are provided on the passivation layer 180. The pixel electrode 191 is connected with the second drain electrode 175b through the contact hole 185b, and the connection member 85 is connected with the second gate electrode 124b and the first drain electrode 175a through the contact holes 184 and 185a.

A barrier rib 460 is provided on the passivation layer 180, and an organic light emission member 470 is provided in an opening between neighboring barrier ribs 460. A common electrode 270 is provided on the organic light emission member 470.

The first gate electrode 124a, the first source electrode 173a, and the first drain electrode 175a form a switching thin film transistor Qs together with the first semiconductor layer 154a. The second gate electrode 124b that is connected to the first drain electrode 175a, the second source electrode 173b, and the second drain electrode 175b form a driving thin film transistor Qd together with the second semiconductor layer 154b, and a channel of the driving thin film transistor Qd is formed in the second semiconductor layer 154b between the second source electrode 173b and the second drain electrode 175b.

Hereinafter, reflectance of a metal wire that includes a blocking layer according to an exemplary embodiment of the present invention will be described with reference to FIG. 19.

Figure 19:
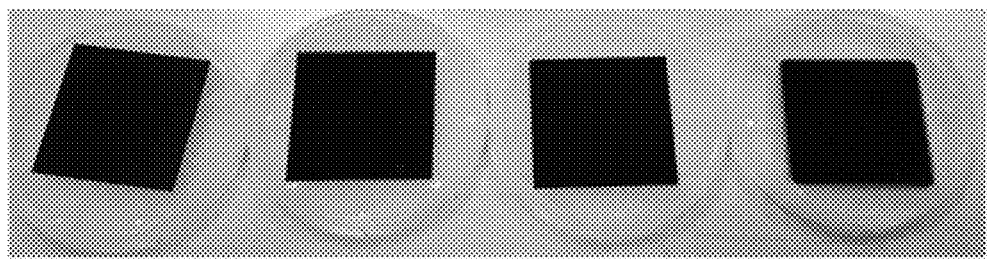
FIG. 19 are images of 4 examples illustrating reflection of metal wires according to an exemplary embodiment of the present invention.

FIG. 19 illustrates Example 1 in which aluminum and MoTaOx are sequentially stacked, Example 2 in which titanium, copper, and MoTaOx are sequentially stacked, Example 3 in which aluminum and MoNbOx are sequentially stacked, and Example 4 in which titanium, copper, and MoNbOx are sequentially stacked in the order from left to right.

Examples 1 to 4 each include a blocking layer that is manufactured through a non-reactive deposition process using Argon gas. In addition, the blocking layer according to the present exemplary embodiment has a property that it is insoluble in water, and accordingly the blocking layer may maintain its stability during a cleaning process. Further, since reflections in Examples 1 to 4 are about 6% or less, it can be clearly observed that reflection of external light is significantly reduced.

Figure 20:
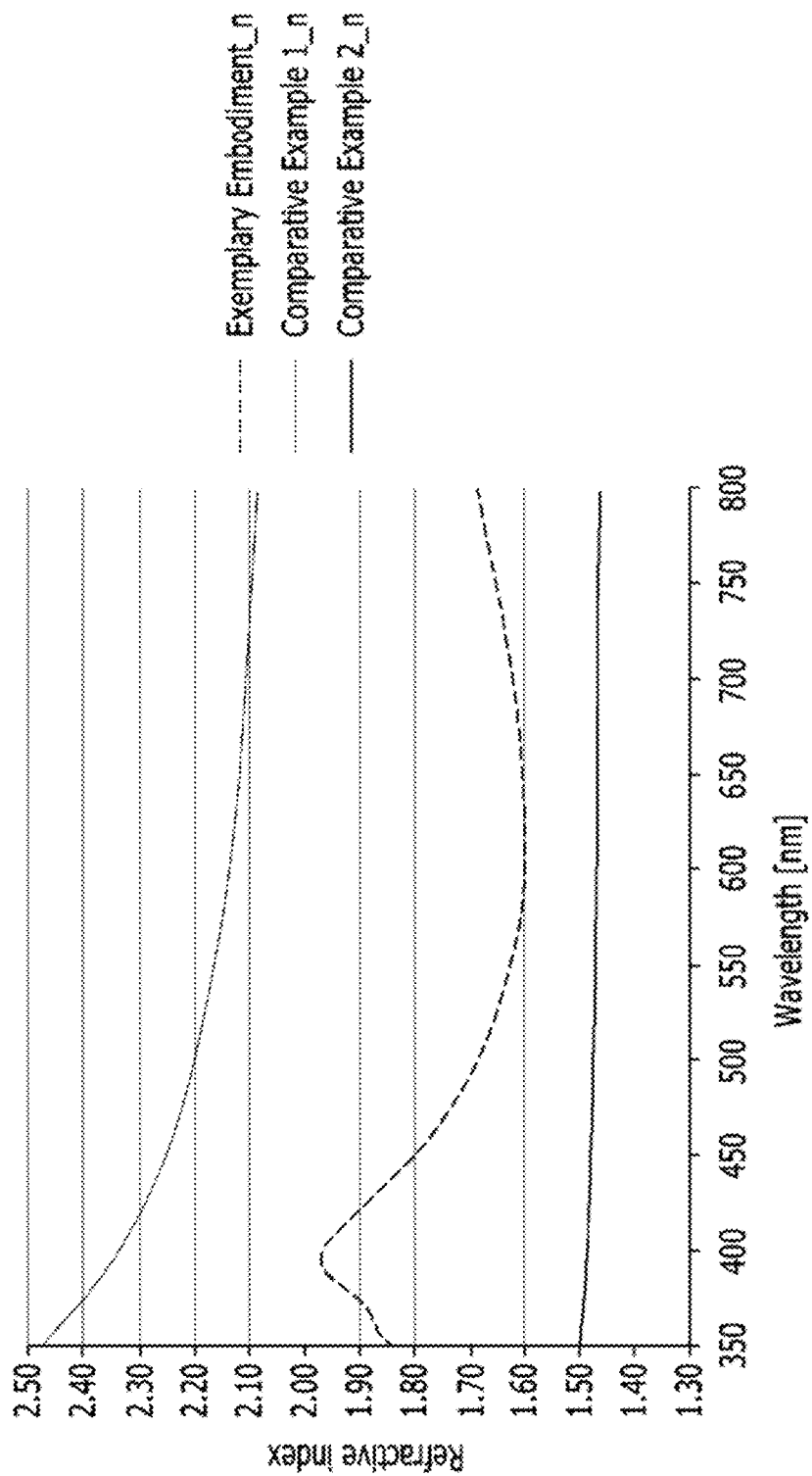
FIG. 20 is a graph illustrating refractive indexes of materials according to an exemplary embodiment of the present invention and comparative examples.
Figure 21:
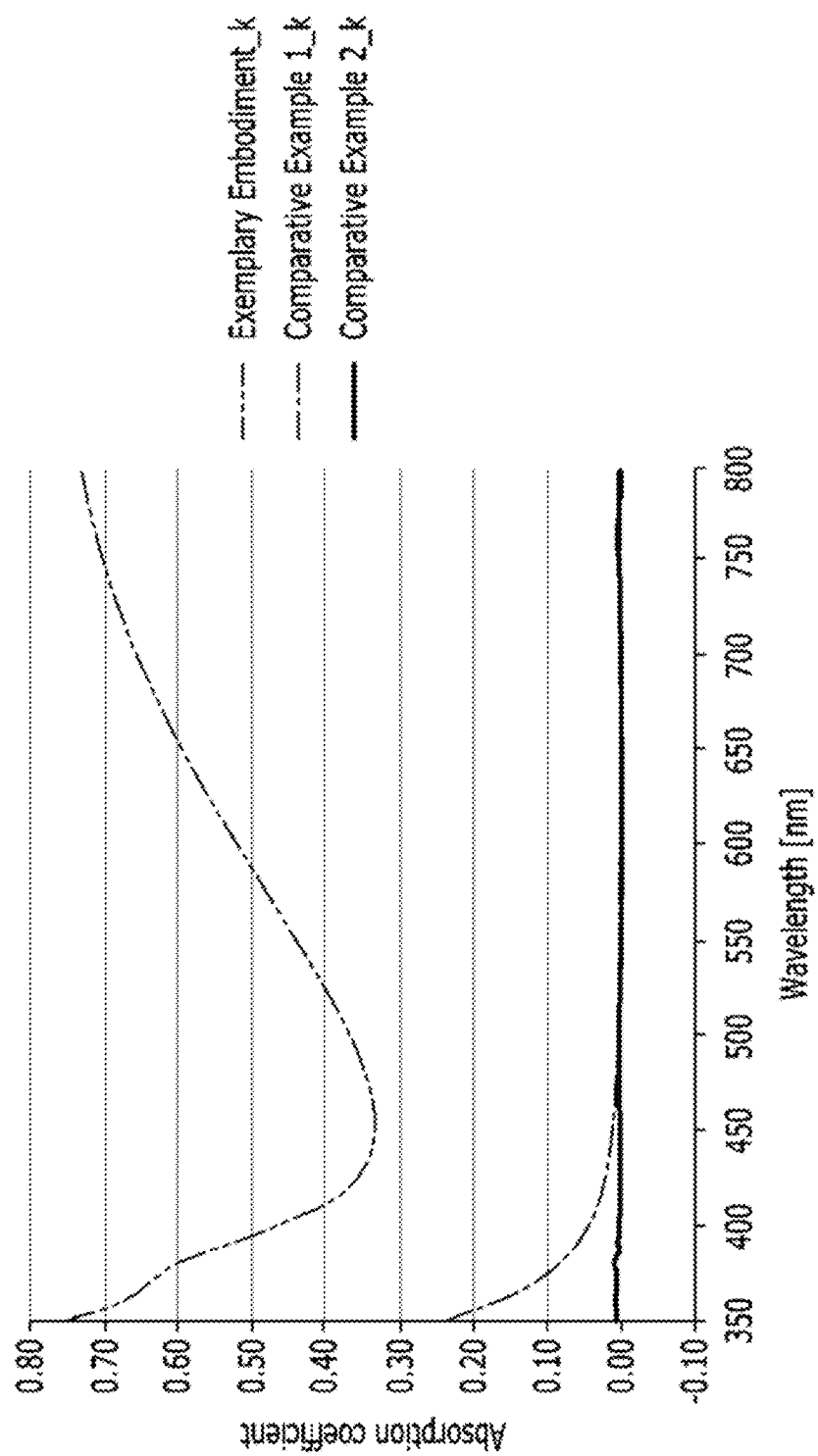
FIG. 21 is a graph illustrating absorption coefficients of materials according to an exemplary embodiment of the present invention and comparative examples.

Hereinafter, properties of materials included in a blocking layer according to an exemplary embodiment of the present invention and a blocking layer according to Comparative Examples 1 and 2 will be described with reference to FIG. 20 and FIG. 21. FIG. 20 is a graph illustrating refractive indexes of the materials according to the present exemplary embodiment and Comparative Examples 1 and 2, and FIG. 21 is a graph illustrating an absorption coefficient of the materials according to the present exemplary embodiment and the Comparative Examples 1 and 2. In this case, the present exemplary embodiment is MoNbOx, Comparative Example 1 is MoOx, and Comparative Example 2 is SiOx.

Referring to FIG. 20 and FIG. 21, the present exemplary embodiment has an average refractive index n of about 1.7 and an average absorption coefficient k of about 0.5320. On the contrary, Comparative Example 1 has an average refractive index n of about 2.2 and an average absorption coefficient k of about 0.0821, and Comparative Example 2 has an average refractive index n of about 1.47 and an average absorption coefficient k of about 0.0008.

In comparison of the absorption coefficient k between the present exemplary embodiment and Comparative Examples 1 and 2, the absorption coefficient of the present exemplary embodiment is about 6 times to about 600 times greater than those of Comparative Examples 1 and 2. That is, the material of the present exemplary embodiment has a high absorption coefficient. When such a material having a high absorption coefficient is used as a blocking layer, excellent external light absorption and destructive interference may be achieved, and accordingly, display quality of the display device may be enhanced.

While this invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. A display device comprising:
a substrate;
a gate line and a data line that are provided on the substrate and are insulated from each other;
a thin film transistor that is connected with the gate line and the data line; and
a pixel electrode that is connected with the thin film transistor,
wherein at least one of the gate line and the data line comprises:
a metal layer; and
a blocking layer that contacts the metal layer, and
wherein the blocking layer is formed of a metal oxide and comprises:
a first metal from a first group including molybdenum (Mo) and tungsten (W);
a second metal from a second group including vanadium (V), niobium (Nb), zirconium (Zr), and tantalum (Ta); and
oxygen (O), and
wherein a content of the second metal is about 3 to 10 wt % with respect to entire content of the blocking layer;
wherein the metal layer comprises a first layer that includes at least one of aluminum (Al) and copper (Cu); and
wherein the metal layer further comprises a second layer that is provided between the substrate and the first layer, and the second layer, the first layer, and the blocking layer are sequentially stacked on the substrate.

2. The display device of claim 1, wherein the display device emits light in a direction toward the thin film transistor from the substrate.

3. The display device of claim 1, wherein the second layer comprises titanium (Ti).

4. The display device of claim 1, further comprising an insulation layer that is provided between the substrate and the blocking layer.

5. The display device of claim 4, wherein the display device emits light in a direction toward the substrate from the thin film transistor.

6. The display device of claim 4, wherein the insulation layer comprises one of silicon oxide (SiOx), silicon nitride silicon oxynitride (SiOxNy), titanium oxide ($TiO_2$), and aluminum oxide ($Al_2O_3$), where x and y are non-zero positive real numbers.

7. The display device of claim 4, wherein the blocking layer is provided between the substrate and the metal layer.

8. The display device of claim 7, wherein the metal layer is provided on the blocking layer, and comprises a first layer that includes at least one of aluminum (Al) and copper (Cu) and a second layer that is provided on the first layer.

9. The display device of claim 8, wherein the second layer comprises titanium (Ti).

* * * * *